United States Patent
Mellin et al.

(10) Patent No.: US 12,267,088 B2
(45) Date of Patent: Apr. 1, 2025

(54) MULTIPLEXED HIGHER ORDER SIGMA-DELTA ANALOG-TO-DIGITAL CONVERTER

(71) Applicant: Murata Manufacturing Co., Ltd., Nagaokakyo (JP)

(72) Inventors: Teemu Mellin, Espoo (FI); Lasse Aaltonen, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 174 days.

(21) Appl. No.: 18/308,261

(22) Filed: Apr. 27, 2023

(65) Prior Publication Data
US 2023/0353166 A1  Nov. 2, 2023

(30) Foreign Application Priority Data
Apr. 29, 2022 (FI) ................................ 20225369

(51) Int. Cl.
H03M 3/00 (2006.01)
(52) U.S. Cl.
CPC ........... *H03M 3/466* (2013.01); *H03M 3/494* (2013.01)
(58) Field of Classification Search
CPC ........ H03M 3/00; H03M 3/466; H03M 3/494; H03M 3/01
See application file for complete search history.

(56) References Cited

U.S. PATENT DOCUMENTS

| | | |
|---|---|---|
| 6,271,782 B1 | 8/2001 | Steensgaard-Madsen |
| 7,515,079 B2 | 4/2009 | Maeda et al. |
| 9,197,242 B2 | 11/2015 | Aaltonen et al. |
| 9,509,332 B1 | 11/2016 | Garrity et al. |
| 2008/0024348 A1 | 1/2008 | Liu |
| 2015/0162935 A1 | 6/2015 | Aaltonen et al. |

OTHER PUBLICATIONS

Sebastiano et al., "A 0.1-mm2 3-Channel Area-Optimized ΣΔ ADC in 0.16-μm CMOS with 20-kHz BW and 86-dB DR", 2013 Proceedings of the ESSIRC (ESSIRC), IEEE, Sep. 16, 2013, pp. 375-378.

*Primary Examiner* — Lam T Mai
(74) *Attorney, Agent, or Firm* — ArentFox Schiff LLP

(57) ABSTRACT

A multiplexed sigma-delta analog-to-digital converter (ADC) is provided for digitizing analog input signals of at least two input channels. The ADC includes input circuitry that obtains samples of the input channels and an integrator chain. The integrator chain includes a first delaying integrator and a second delaying integrator. The first delaying integrator processes a sample of one of the two input channels at a time. A first non-delaying integrator is disposed in the integrator chain either between the first delaying integrator and the second delaying integrator or after the second delaying integrator. A clocking arrangement includes a first clock set and a second clock set. Channel selection clocks included in the second clock set are delayed in comparison to the respective channel selection clocks included in the first clock set in order to prevent data from being mixed between consecutive full clock cycles.

20 Claims, 23 Drawing Sheets

MULTIPLEXED HIGHER ORDER SIGMA-DELTA ANALOG-TO-DIGITAL CONVERTER

CROSS REFERENCE TO RELATED APPLICATIONS

This application claims priority to Finnish Patent Application No. 20225369, filed Apr. 29, 2022, the entire contents of each of which are hereby incorporated by reference in its entirety.

TECHNICAL FIELD

The present invention relates to sigma-delta analog-to-digital conversion. More particularly, the invention relates to a higher-order multiplexed sigma-delta analog-to-digital converter and a method of operation thereof.

BACKGROUND

The need for high performance analog-to-digital converters (ADC) typically rises from bandwidth limitation. Bandwidth refers to a signal band of interest at which noise level should be low. In this meaning, bandwidth can be considered as equivalent to output data rate or decimated data rate. FIG. 1 illustrates bandwidth by a view of noise spectrum (100) of a single-bit low-pass 2nd order sigma-delta ADC ("SDADC"). As known in the art, a sigma-delta or delta-sigma ADC uses modulation for encoding analog signals into digital signals. In delta modulation, the change in the signal, i.e., delta of the signal, is encoded with a single-bit ADC (35) rather than its absolute value. The result is a stream of pulses. Accuracy of the modulation is improved by passing the digital output through a quantizer, in this example a 1-bit DAC (40) and adding the resulting analog signal via a feedback loop (41) to the input signal before the delta calculation and integration, the latter referring to calculation of sum (sigma) of consecutive delta sample. The feedback loop reduces error introduced by the delta modulation and the sum operation shapes the heavy quantization noise, resulting from single bit quantization, away from the signal band.

In FIGS. 1, 2 and 4, horizontal line indicates a target noise level (110) for signal frequency range starting at 0 Hz. As long as the noise level remains below this target noise level (110), the analog-to-digital conversion is considered to fulfill set requirements. The exemplary SDADC bitrate (BR) or data rate (DR) is 2.56 MHz and quantization noise limited bandwidth is below 5 kHz. A 5 kHz AC signal (120) with amplitude of signal of 0.25*reference voltage of the ADC is used to illustrate the bandwidth limitation.

One option to increase signal bandwidth is to increase order of the SDADC. FIG. 2 illustrates output spectrum of a 3rd order SDADC, with similar data rate and the same 5 kHz AC signal as in FIG. 1. Noise-transfer function ("NTF") is set to be high-pass Butterworth with corner frequency at $\frac{1}{20}*F_n$, where $F_n$ is the Nyquist frequency of the bitrate. The assumed modulator topology in this example is multiple feedback ("MFB"), which is typical for analog modulators. By adding one integrator to the SDADC in comparison to the 2nd order SDADC, bandwidth increases and is now almost 10 kHz.

FIG. 3 illustrates an exemplary high-level block diagram of a 3rd order SDADC modulator that implements the spectrum shown in FIG. 2. Input signal (Vin) travels through three integrators (30, 32, 33). Two first integrators (30, 32) are non-delaying and the third integrator (33) is a delaying one. A sampling amplifier (Ks) amplifies the sample before it enters the first integrator (30), and integration amplifiers (Ki1, Ki2, Ki3) are provided after each integrator. A quantizer (35) produces the digital output signal. In this example, the quantizer (35) is a 1-bit quantizer, i.e. a comparator that compares input voltage to a reference voltage, but a higher order quantizer, such as 1.5 bit, 2 bit or 2.5 quantizer could also be applied. Use of a higher order quantizer reduces noise but increases risk for non-linearity of the analog-to-digital conversion. A 1-bit digital-to-analog converter, DAC (40) produces a feedback signal for the multiple feedback loop (41). Feedback amplifiers (Kf1, Kf2, Kf3) may be provided in the multiple feedback loop before the feedback signal is summed into the input signal of each integrator (30, 32, 33). As known in the art, feedback signal is generated from the output signal of the ADC (35) and represents the previously converted sample. While the first two integrators (30, 32) are non-delaying, sampled input signal is immediately available at the input of the third, delaying integrator (33), which, as known in the art, delays the signal by a half of a clock cycle.

One way to widen the effective bandwidth is by implementing a notch in the noise-transfer function. A noise spectrum (100) of a SDADC with a notch is illustrated in FIG. 4. In this example, the notch (105) is set at 10 kHz, while bit rate is the same as in FIGS. 1 and 2, namely 2.56 MHz. The notch allows a slightly wider bandwidth compared to the pure Butterworth noise-transfer function shown in FIG. 2 achieved with the SDADC of FIG. 3. Furthermore, the notch can be implemented at a frequency at which it is especially relevant for achieving a low noise level.

FIG. 5 illustrates a high-level block diagram for implementing an SDADC with the notched noise-transfer function shown in FIG. 4. The notch is achieved by adding a local feedback line (36). In comparison to the 3rd order SDADC shown in FIG. 2, the first integrator (31) is changed into a delaying one so that input drive does not need to settle at the same time as the first two integrators (31, 32) in the SDADC. Because of this change, timing of feedback to the first integrator (31) needs to be different from timing of feedback to the two latter integrators (32, 33), which is shown in the circuit diagram by a separate feedback loops (41, 41') from the DAC (40).

Although the notched SDADC design shown in FIG. 5 solves the problem of bandwidth limitation, a problem arises if multiple channels should be multiplexed in such circuit topology. With more than one delaying integrator, the sampled data would become incorrectly channel multiplexed, because two half-cycle delaying integrators in the integrator chain causes a full clock cycle delay.

U.S. Pat. No. 9,197,242 B2 discloses implementation of area efficient multiplexed delta-sigma analog-to-digital converter (ADC). However, the configuration described in this patent does not allow using a higher-order sigma-delta ADC and is limited to a single delaying integrator stage to avoid incorrect channel multiplexing.

Thus, a solution is needed to enable channel multiplexing in a higher-order SDADC (i.e., third and fourth order SDADC) that has two delaying integrators.

SUMMARY OF THE INVENTION

Accordingly, it is an object of the invention to provide a method and apparatus that provides for multiplexing channels in a higher-order SDADC.

In particular, the exemplary aspects of the present invention are premised on preventing the mixing of channel information in the SDADC having two delaying integrator stages by determining two channel selection clock sets and delaying local feedback if applied, as well as applying multiple modulator feedback signals with mutually different timing. The second channel selection clock set is delayed in comparison to the first channel selection clock set that is used for first two integrators. According to some exemplary aspects, the same advanced clocking principle can also be applied to oversampling a single channel using multiple sampling capacitor pairs.

Advantageously, the exemplary aspects, improve applicable bandwidth by lowering noise levels and/or by implementing a notch in the noise transfer function, in a multiplexed higher-order SDADC. Oversampling improves quantization noise shaping and further increases bandwidth.

According to a first exemplary aspect, a multiplexed sigma-delta analog-to-digital converter (ADC) is provided for digitizing analog input signals of at least two input channels. In this aspect, the ADC comprises: input circuitry configured to obtain samples of said at least two input channels, and a multiplexed integrator chain comprising a first delaying integrator and a second delaying integrator, wherein the first delaying integrator is configured to process a sample of one of said at least two input channels at a time, and a first non-delaying integrator disposed in the integrator chain between the first delaying integrator and the second delaying integrator, or after the second delaying integrator. Moreover, a clocking arrangement of the multiplexed sigma-delta ADC comprises a first clock set comprising first clocks and first channel selection clocks configured to control the first delaying integrator and the first non-delaying integrator when it is disposed between the first delaying integrator and the second delaying integrator, and a second clock set comprising second clocks and second channel selection clocks configured to control the second delaying integrator and the first non-delaying integrator when it is disposed after the second delaying integrator, wherein the second channel selection clocks are delayed in comparison to the respective first channel selection clocks for preventing data from being mixed between consecutive full clock cycles.

According to the exemplary aspect, the ADC further comprises a quantizer configured to convert an output of a last integrator in the integrator chain into a digital signal, a first feedback line configured to feed back a first feedback signal at input of first delaying integrator, and a second feedback line configured to feed back a second feedback signal at respective inputs of the first non-delaying integrator and the second delaying integrator. Moreover, the first feedback signal and the second feedback signal represent an analog value corresponding to a digital signal at the output of the sigma-delta ADC.

According to another exemplary aspect, each of the first and second feedback lines comprises feedback capacitor sets coupled at the input of the respective integrators, and the respective feedback capacitor sets are configured to be charged with a positive or negative charge according to a former digital output of the multiplexed sigma-delta ADC, the former digital output concerning the respective one of the at least two channels that is currently being integrated by the respective integrator.

According to another exemplary aspect, the former digital output is obtainable from one of at least two digital output registers coupled to the output of the quantizer, one output register for each of the at least two channels.

According to another exemplary aspect, the multiplexed sigma-delta ADC further comprises a local feedback loop configured to feed back a local feedback signal at an input of the second integrator in the integrator chain. The local feedback signal corresponds to an analog output signal received at the output of the third integrator in the integrator chain. The local feedback loop comprises a local feedback circuitry comprising at least two parallel capacitors for storing respective feedback charges of the at least two channels as the local feedback signal and a switching arrangement for selecting the local feedback signal of the respective one of the channels to be fed back at the input of the first non-delaying integrator.

According to another exemplary aspect, generation of the local feedback signal is controlled on basis of the second clock set and feeding back the local feedback signal is controlled on basis of the first clock set for preventing data from being mixed between consecutive full clock cycles.

According to another exemplary aspect, the second channel selection clocks are delayed in comparison to the respective first channel selection clocks by less than a half of a full clock cycle determined by two consecutive first reset clocks of the first clock set, and by more than duration of a reset period determined by the first reset clock of the first clock set.

According to another exemplary aspect, when no dedicated reset clocks are included in the first and second clock sets, the second channel selection clocks are delayed in comparison to the respective first channel selection clocks by more than duration of a clock period that causes coupling of a sampling capacitor set of the first delaying integrator to an analog ground between two consecutive samples and causes coupling of the first feedback loop and the second feedback loop to the analog ground.

According to another exemplary aspect, a sampling capacitor set of the first delaying integrator comprises at least two parallel sampling capacitors for single-ended operation or at least two parallel sampling capacitor pairs for double-ended operation, and wherein number of parallel sampling capacitors or parallel sampling capacitor pairs in the sampling capacitor set equals the number of channels that are being multiplexed or, when all sampling capacitors or all sampling capacitor pairs are configured to simultaneously store samples of the same channel, number of parallel sampling capacitors or parallel sampling capacitor pairs equals the number of parallel samples of the one input channel that are stored simultaneously.

According to another exemplary aspect, the sampling capacitor set is configured to store samples of said at least two analog input channels simultaneously and said samples of said at least two analog input channels are moved forward for integrating a sample of one channel at a time.

According to another exemplary aspect, the sampling capacitor set is configured to sample said analog input channels at mutually different times, storing simultaneously at least two samples of the same one of the at least two analog input channels, and a switching arrangement is configured to move these at least two samples of the same one of the at least two analog input channels forward for integrating the at least two samples of the same channel one sample at a time during at least two consecutive full clock cycles.

According to some aspects, the second non-delaying integrator is disposed as the last integrator in the integrator chain. Moreover, the second clock set is further configured to control the second non-delaying integrator.

According to another exemplary aspect, the multiplexed sigma-delta ADC comprises circuitry configured to reset operational amplifier of each integrator in the integrator chain at the beginning of each adjacent full clock cycle of the respective integrator, before integrating the next sample, irrespective of whether the integrator processes different channels at each adjacent full clock cycle or the same channel multiple times during adjacent full clock cycles.

According to another exemplary aspect, a switching arrangement of the second feedback loop is provided that effectively implements a delay in feeding the second feedback signal towards the first non-delaying integrator and the second delaying integrator in comparison to feeding the first feedback signal towards the first delaying integrator for preventing feedback signals from being mixed between consecutive full clock cycles.

According to yet another exemplary aspect, a sigma-delta analog-to-digital conversion method is provided for digitizing analog input signals of at least two input channels by a multiplexed sigma-delta analog-to-digital converter (ADS). The exemplary method includes integrating a sample of one of said at least two input channels at a time by a multiplexed integrator chain, the integrating including integrating the sample by a first delaying integrator in the integrator chain, wherein operation of the first delaying integrator is controlled by a first clock set comprising first clocks and first channel selection clocks, integrating the sample by a first non-delaying integrator disposed in the integrator chain right after the first delaying integrator, wherein the first non-delaying integrator is controlled by the first clock set, and integrating the sample by a second delaying integrator disposed in the integrator chain topologically after the first delaying integrator, wherein the second delaying integrator is controlled by a second clock set comprising second clocks and second channel selection clocks. The method according to this exemplary aspect, further includes quantizing an output of a last integrator in the integrator chain to provide an output of the multiplexed sigma-delta ADC; delaying the second channel selection clock set relative to the first channel selection clock set to prevent data from being mixed between consecutive full clock cycles; feeding back a first feedback signal at an input of the first delaying integrator; and feeding back a second feedback signal at respective inputs of the first non-delaying integrator and the second delaying integrator. In this aspect, the first and second feedback signals represent an analog value that corresponds to a digital signal at an output of the multiplexed sigma-delta ADC.

According to yet another exemplary aspect, a sigma-delta analog-to-digital conversion method is provided for digitizing analog input signals of at least two input channels by a multiplexed sigma-delta analog-to-digital converter (ADS). In this aspect, the method further includes integrating a sample of one of said at least two input channels at a time by a multiplexed integrator chain, the integrating including integrating the sample by a first delaying integrator in the integrator chain, wherein operation of the first delaying integrator is controlled by a first clock set comprising first clocks and first channel selection clocks, integrating the sample by a first non-delaying integrator disposed in the integrator chain right after a second delaying integrator, wherein the first non-delaying integrator is controlled by a second clock set comprising second clocks and second channel selection clocks, and integrating the sample by the second delaying integrator disposed in the integrator chain topologically after the first non-delaying integrator, wherein the second delaying integrator is controlled by the second clock set. The method according to this exemplary aspect, further includes quantizing an output of a last integrator in the integrator chain to provide an output of the multiplexed sigma-delta ADC; delaying the second channel selection clock set relative to the first channel selection clock set to prevent data from being mixed between consecutive full clock cycles; feeding back a first feedback signal at an input of the first delaying integrator; and feeding back a second feedback signal at respective inputs of the first non-delaying integrator and the second delaying integrator. In this aspect, the first and second feedback signals represent an analog value that corresponds to a digital signal at an output of the multiplexed sigma-delta ADC.

According to additional exemplary aspects of the methods, said feeding back comprises charging a feedback capacitor set coupled at the input of the respective integrator with a positive or negative charge according to a former digital output of the multiplexed sigma-delta ADC, the former digital output concerning the respective one of the at least two channels that is currently being integrated by the respective integrator.

According to additional exemplary aspects, the methods can further comprise obtaining the former digital output from one of at least two digital output registers coupled to the output of the quantizer, one output register for each of the at least two channels.

According to additional exemplary aspects, the methods can further comprise feeding back a local feedback signal at an input of the second integrator in the integrator chain, wherein the local feedback signal corresponds to an analog output signal received at the output of the third integrator in the integrator chain. Moreover, feedback charge to be used as the local feedback signal of one of the at least two channels is stored to one of at least two parallel capacitors of a local feedback circuitry, and the feedback charge is provided at the input of the first non-delaying integrator by a switching arrangement of the local feedback circuitry for selecting the local feedback signal of the respective one of the channels to be fed back.

According to additional exemplary aspects, the methods can further comprise controlling generation of the local feedback signal on basis of the second clock set and controlling feeding back the local feedback signal on basis of the first clock set for preventing data from being mixed between consecutive full clock cycles.

According to additional exemplary aspects, the methods can further comprise delaying the second channel selection clock set in comparison to the first channel selection clock set by less than a half of a full clock cycle determined by two consecutive first reset clocks of the first clock set, and by more than duration of a reset period determined by the first reset clock of the first clock set, or, when no dedicated reset clocks are included in the first and second clock sets, delaying the second channel selection clocks in comparison to the first channel selection clocks by more than duration of a clock period that causes coupling of a sampling capacitor set of the first delaying integrator to an analog ground between two consecutive samples and causes coupling of the first feedback signal and the second feedback signal to the analog ground.

According to additional exemplary aspects, the methods can further comprise storing simultaneously samples in at least two parallel sampling capacitors for single-ended operation or in at least two parallel sampling capacitor pairs for double-ended operation, wherein number of parallel sampling capacitors or sampling capacitor pairs equals the number of channels that are being multiplexed or, when all sampling capacitors or all sampling capacitor pairs are used to store simultaneously samples of the same channel, the number of parallel samples of the one input channel that are stored simultaneously.

According to additional exemplary aspects, the methods can further comprise storing samples of the at least two analog input channels simultaneously and moving said samples of said at least two analog input channels forward for integrating a sample of one channel at a time.

According to additional exemplary aspects, the methods can further comprise storing at least two samples of the same one of the at least two analog input channels simultaneously, and moving these at least two samples of the same one of the at least two analog input channels for integrating the at least two samples of the same channel one sample at a time during at least two consecutive full clock cycles.

According to additional exemplary aspects, the methods can further comprise integrating the sample by a second non-delaying integrator disposed as the last integrator in the integrator chain, wherein the operation of the second non-delaying integrator is controlled by the second clock set, and quantizing output of the second non-delaying integrator as the last integrator in the integrator chain.

According to additional exemplary aspects, the methods can further comprise resetting operational amplifier of each integrator in the integrator chain at the beginning of each adjacent full clock cycle of the respective integrator, before integrating the next sample, irrespective of whether the integrator processes different channels at each full clock cycle or the same channel multiple times during adjacent full clock cycles.

According to additional exemplary aspects, the methods can further comprise delaying feeding of the second feedback signal towards the first non-delaying integrator and the second delaying integrator in comparison to feeding of the first feedback signal towards the first delaying integrator for preventing feedback signals from being mixed between consecutive full clock cycles.

BRIEF DESCRIPTION OF THE DRAWINGS

In the following, the exemplary aspects will be described in greater detail, in connection with embodiments, with reference to the attached drawings, in which.

DETAILED DESCRIPTION

In the following description, terms "set of xx capacitors" and "xx capacitor set" are used to refer either to a single capacitor of a single-ended circuitry or two capacitors of a double-ended circuitry. Parallel capacitors with switching arrangement for handling multiplexed signals are referred to as "capacitor circuitries". As understood by the skilled person, in a single-ended design a single capacitor circuitry is needed to perform each function, and in a double-ended design, two capacitor circuitries are needed as shown in the Figures. Thus, term set may be used also in connection to capacitor circuitries as for capacitors, although not used in the description for clarity.

Figure 5:
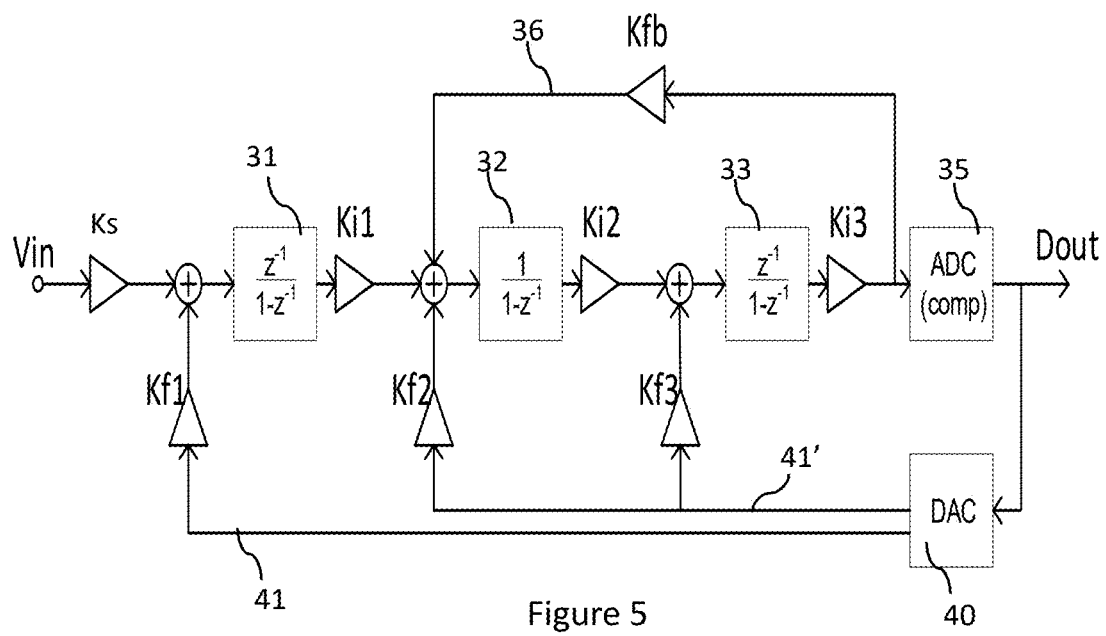
FIG. 5 illustrates a high-level block diagram for implementing an SDADC with the notched noise-transfer function.
Figure 6:
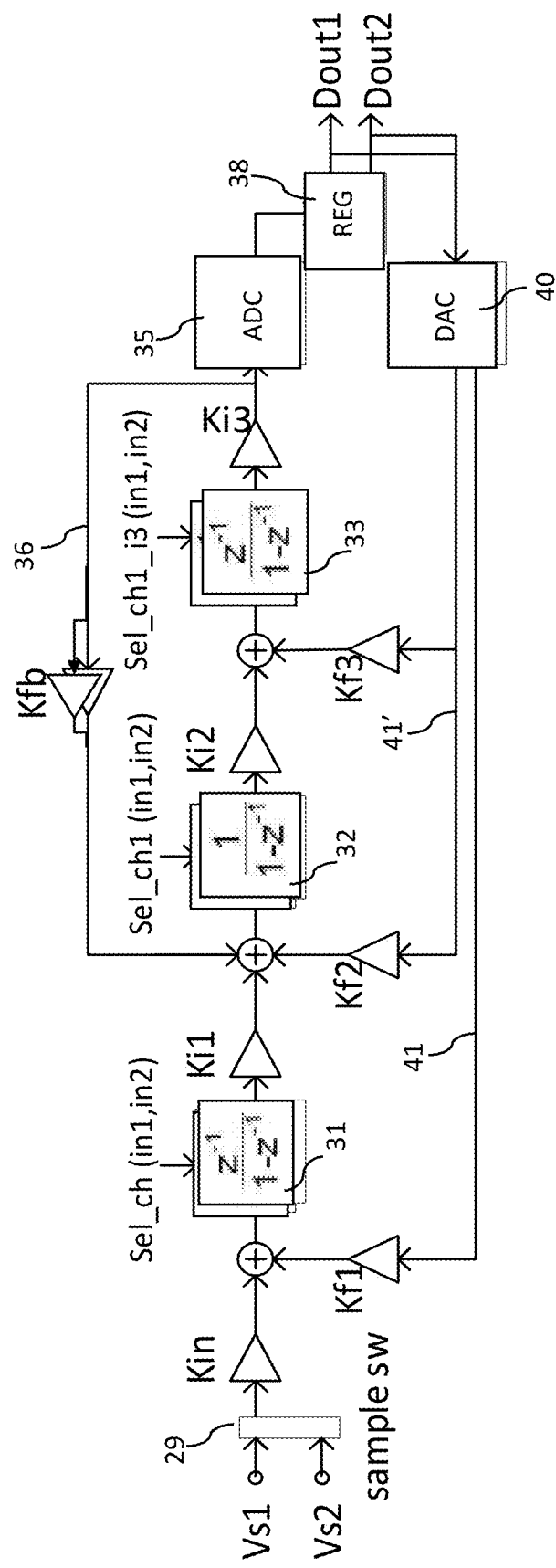
FIG. 6 illustrates in block level a third order SDADC with two-channel multiplexing capacity.

FIG. 6 illustrates in block level a third order SDADC with two-channel multiplexing capacity. Multiplexing is illustrated as doubling circuit elements that comprise circuitry implementing the multiplexing capability, such as parallel capacitors for handling different channels. These circuitry arrangements will be discussed in more detail later. The doubling refers to doubling of memory elements. For example, for integrator, this refers to integration capacitor, which needs to be doubled. The operational amplifier and capacitors, which have periodically reset signal charge, do not need doubling. A third order SDADC has an integrator chain with three consecutive integrators. To analog input channels (Vin1, Vin2) are sampled in parallel using a sample switch (29). The third integrator (33) in the integrator chain has a different, second channel selection clock set (sel_ch_i3) in comparison to the first channel selection clock set (sel_ch) of the preceding two integrators (32, 33). A notch, which is an optional feature for adjusting the noise transfer function, has been implemented using local feedback (36) and as in the circuitry of FIG. 5, and feedback lines (41, 41') are separated so that they can have mutually different timings of the integrators (31; 32, 33). Two Kfb elements in the local feedback (36) refer to parallel delaying elements for enabling correct timing for feedback for the two channels. As can be seen from the schematics 11A, 11B and 11C, the same two feedback signals VREFP and VREFN used for both feedback lines (41, 41'), but there is a difference on timing of feedback. In other words, different clocks are used to control when the feedback signal is received by the integrators. For the first integrator (31) feedback line (41) is controlled by clocks fm2 and fp2, whereas feedback to the second integrator (32) and the third integrator (33) is controlled by clocks "fp" and "fm".

An output register (38) stores digital output for each channel. The term channel selection clock set in a two-channel system refers to a pair of channel selection clocks having mutually opposite phases so that one channel is active at a time. Likewise, in a three-channel system channel selection clock set refers to three channel selection clocks, with just one of these is active at a time, and in a N-channel system the channel selection clock set refers to N channel selection clocks, out of which one is active at a time. In this application, a set of channel selection clocks is described, and the set the number of channels can be anything from two to N, wherein N is a positive integer greater than 2.

Use of delaying integrators in the modulator loop is preferred to avoid multiple integrators to settle at the same time, which would increase current consumption due to increased settling speed requirement. The first integrator is typically implemented as delaying integrator for example to be able to sample multiple input channels at the same time instant and then feed samples into an integration capacitor at each channel.

However, multiplexing becomes difficult when more than one delaying integrator is used, because sampled data would become incorrectly channel multiplexed when total delay in the integrator chain is a full clock cycle.

Figure 7:
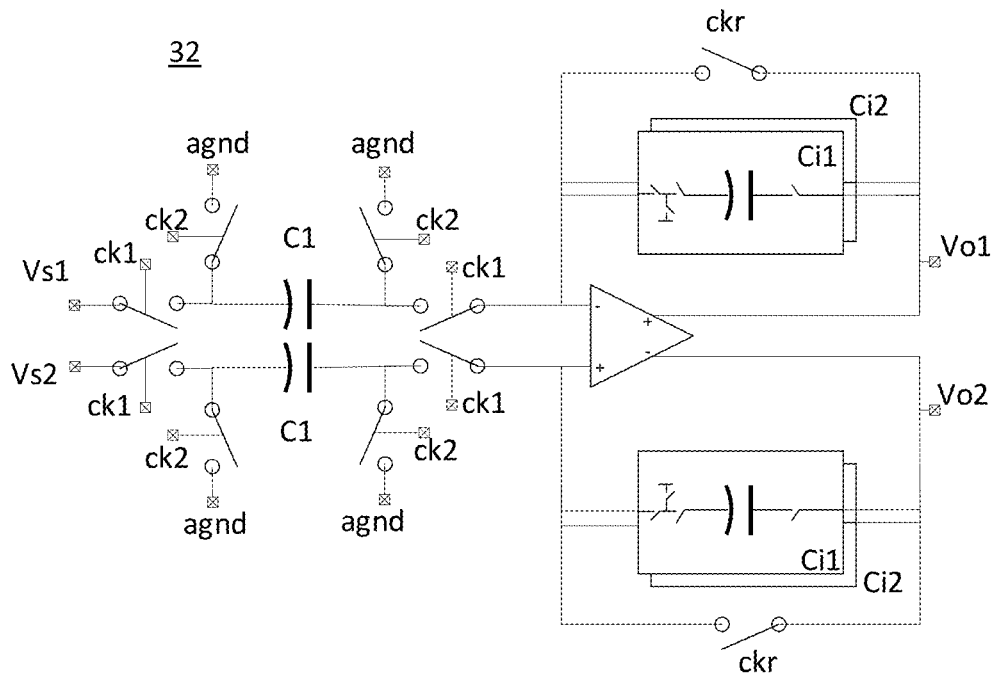
FIG. 7 illustrates a non-delaying two-channel integrator with two sets of integration capacitors.

FIG. 7 illustrates a non-delaying two-channel integrator with two sets of integration capacitors (Ci1, Ci2) that enable integrating two channels. In a non-delaying integrator, changes in input (Vs1, Vs2) are always visible at the output (Vo1, Vo2) without delay. A reset clock (ckr) enables resetting the operational amplifier before the next sample is handled. Integration capacitors are always disconnected, when reset is applied during normal data conversion to conserve the charge in the integration capacitor. In start-up, reset can also be used to initially zero the integration capacitors.

Figure 8:
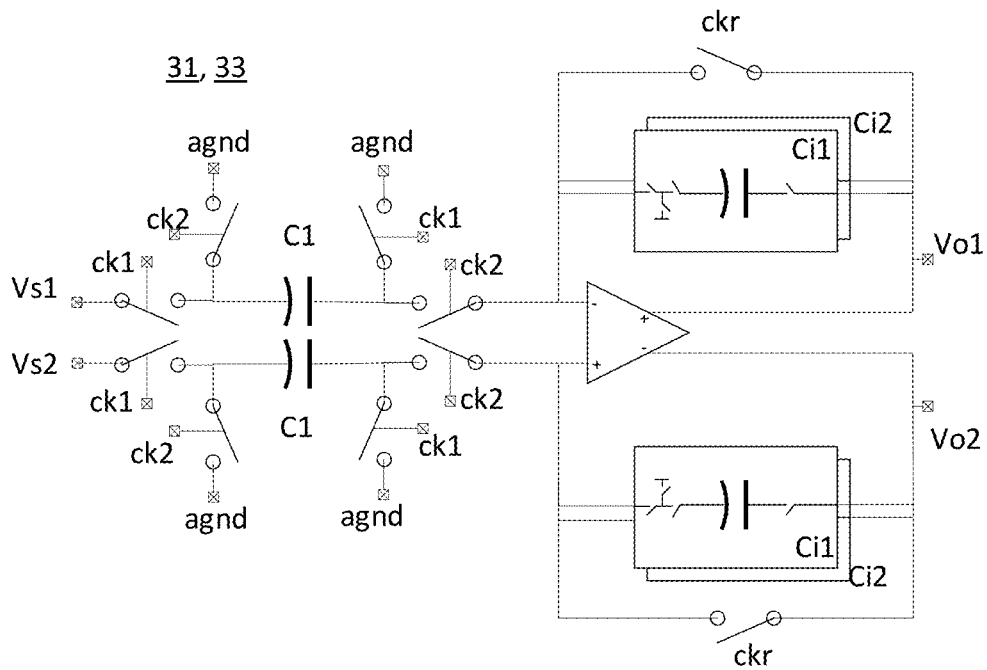
FIG. 8 illustrates a delaying two-channel integrator with two sets of integration capacitors.

FIG. 8 illustrates a delaying two-channel integrator with two sets of integration capacitors (Ci1, Ci2) that enable integrating two channels. The only apparent difference between these non-delaying and delaying integrators is how clocks (ck1, ck2) control switches of the integrator circuitry that control handling the sample charge stored in the sampling capacitor (C1).

To enable multiplexing, a reset of the operational amplifier of the integrator needs to be applied between channels to avoid any cross-coupling between adjacent channels. For example, the clock phase order may be . . . res, ck1, ck2, res, ck1, ck2, . . . . Two channel selection clocks (SEL_CH1, SEL_CH2) in this first channel selection clock set are mutually dependent: they have opposite phases but always change phase at the same time. When the channel selection clocks overlap with clocks ck1 and ck2, and there are two delaying integrators with combined delay of a full clock cycle of the integrator comprising res, ck1 and ck2, channel data becomes mixed.

Figure 1:
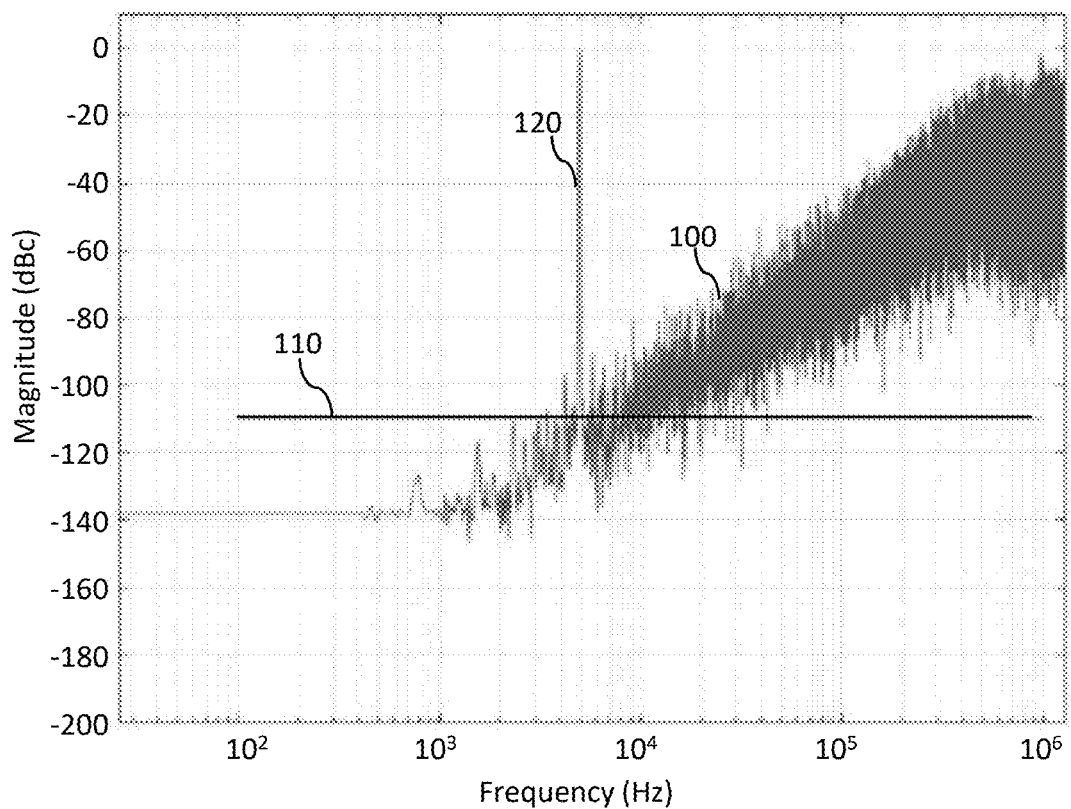
FIG. 1 illustrates bandwidth by a view of noise spectrum (100) of a single-bit low-pass $2^{nd}$ order sigma-delta ADC.
Figure 2:
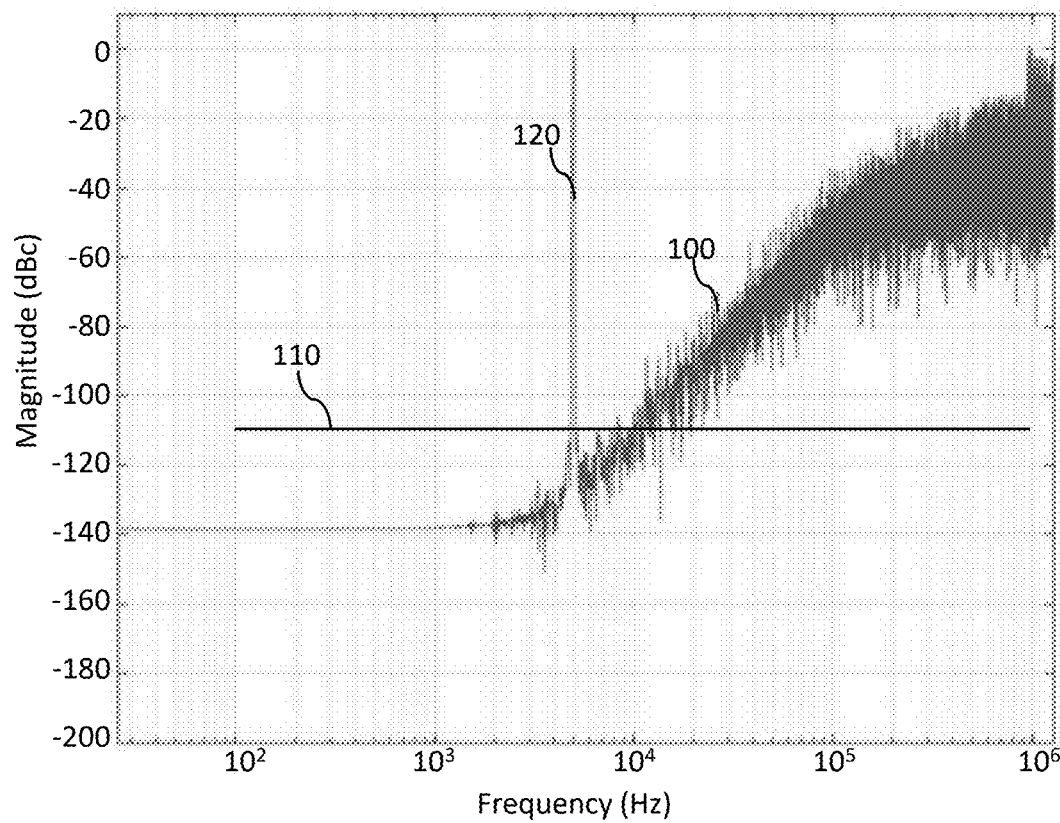
FIG. 2 illustrates output spectrum of a 3rd order SDADC.
Figure 3:
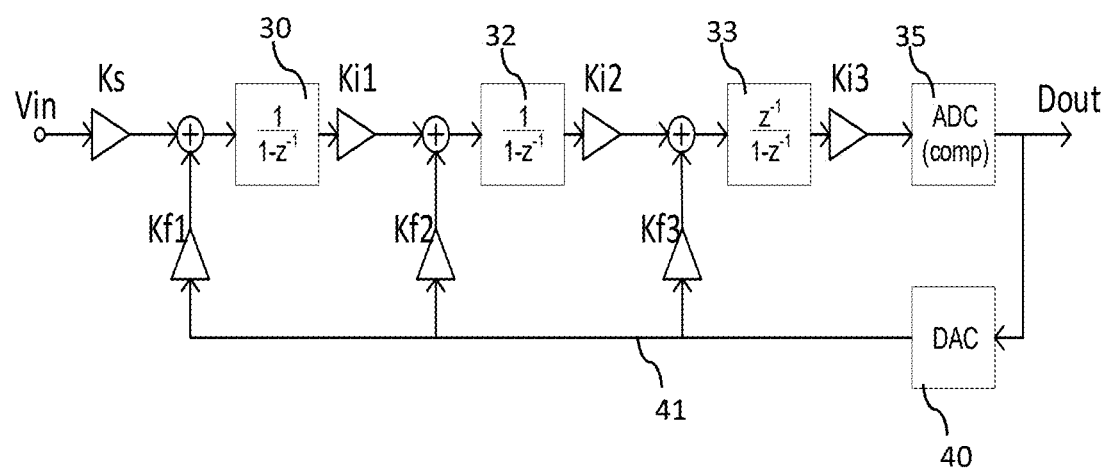
FIG. 3 illustrates a high-level block diagram of a 3rd order SDADC modulator.
Figure 4:
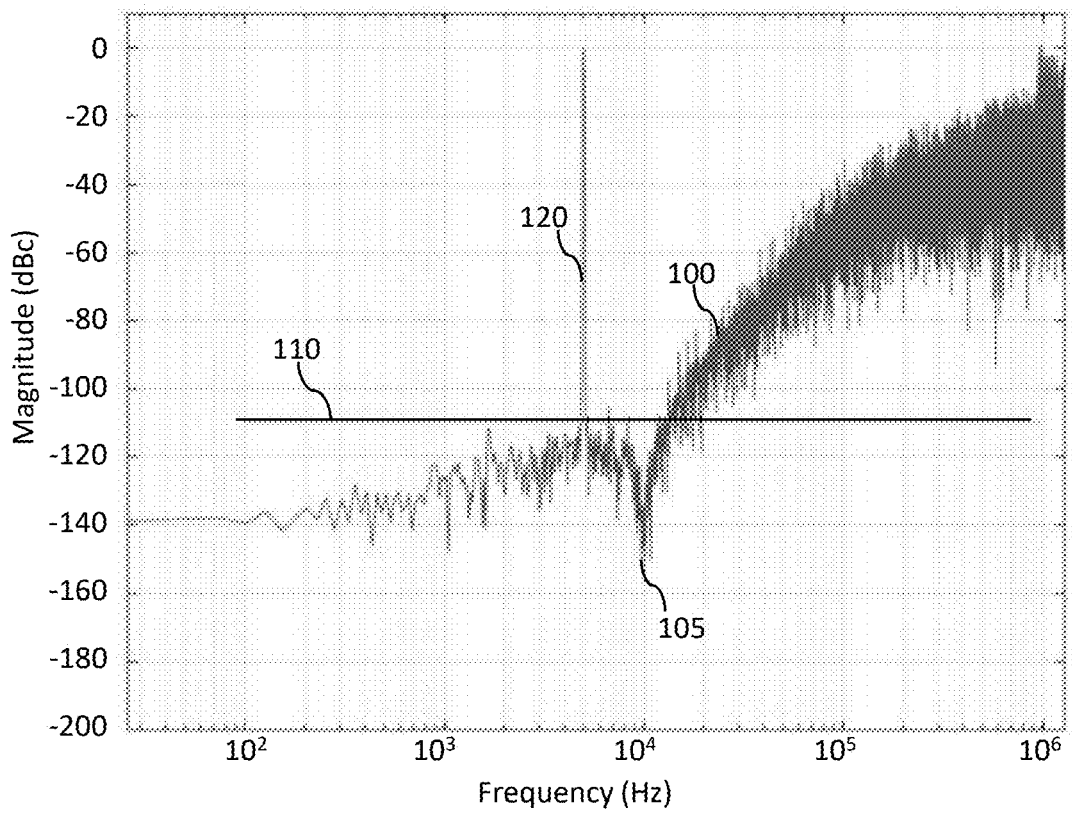
FIG. 4 illustrates noise spectrum with a notch.
Figure 9:
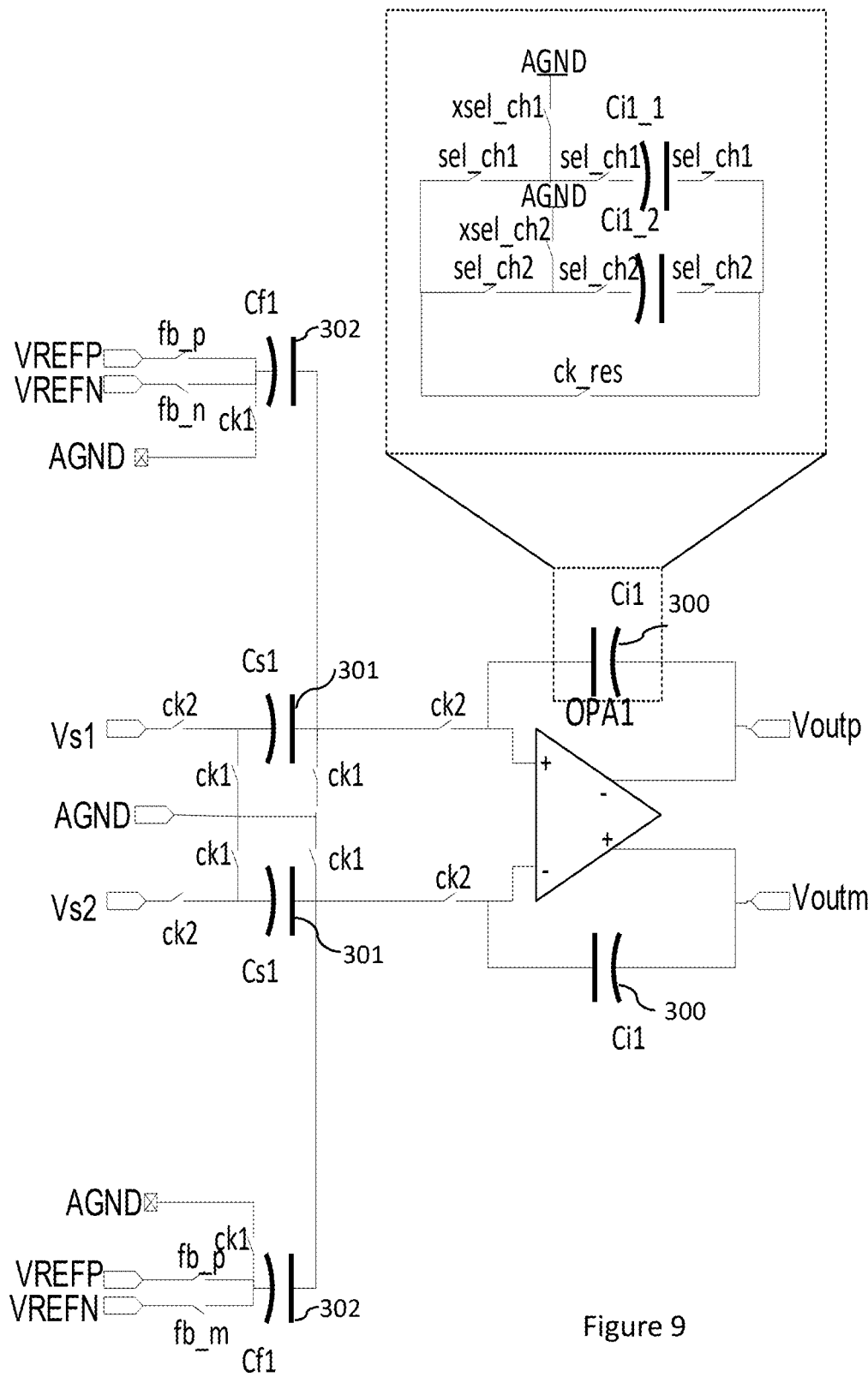
FIG. 9 illustrates circuitry of a non-delaying first integrator.

FIG. 9 illustrates details of the non-delaying first integrator 30 of FIG. 3. In particular, the non-delaying first integrator 30 takes a sample from input at ck2 via sampling capacitor Cs1 (301). The feedback also takes place at ck2 phase and the feedback binary charge via feedback capacitors Cf1 (302) is delivered to the non-delaying first integrator 30. The feedback is received with delay and therefore the binary value fed back to the integrator corresponds to previous output of the modulator of the respective channel. In practice, feedback can be implemented by using digital output of the modulator for controlling switches (fb_p, fb_m) that feed either a positive or a negative charge into the feedback capacitors Cf1 (302).

Next, the feedback and sampling capacitors Cs1 (301) are connected to ground on ck1 after which the non-delaying first integrator (30) is reset during ck_res and same operation cycle is repeated for the second channel. A limitation in this implementation is that local feedback is not possible and therefore the modulator cannot be implemented to have a notch in the noise transfer function.

First integrating capacitors Ci1 (300) are illustrated in the main circuit diagram as single capacitors, but actual circuitry of the first integrating capacitor circuitry Ci1 (300) that includes two parallel capacitors and switching for facilitating handling of two multiplexed channels is shown in the enlarged view.

Figure 10:
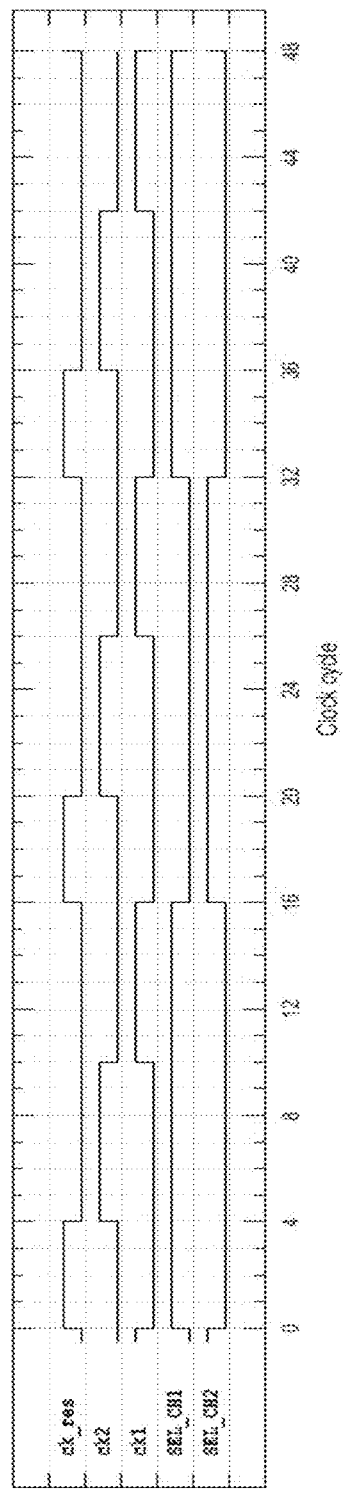
FIG. 10 shows clock signals of a multiplexing 3rd order SDADC without local feedback.

FIG. 10 illustrates clock signals of a multiplexing 3rd order SDADC without local feedback. This corresponds to FIG. 3 where two first integrators used are non-delaying with a difference that the modulator multiplexes two signals, i.e., digitizes two analog signals in parallel. Clock phase sequence includes a reset phase. In this example, the repeating clock sequence is . . . ck1, ck2, res, ck1, ck2, res, . . . . To make this system work, the input signal needs to be available at the same time with each channel selection being active (SEL_CH1 & SEL_CH2). Furthermore, first two integrators (31, 32) settle together with input signal, which increases power consumption. One practical improvement with clock signals as in FIG. 10 is to change the first integrator to be a delaying integrator, which allows the input to be sampled at a different time compared than respective charge transfer.

FIGS. 11A to 11E show a circuit diagram of a third-order two-channel multiplexing SDADC according to a first exemplary embodiment. A timing diagram of clocks used in the following description of operation of the circuitry is shown in FIG. 12.

Figure 11A:
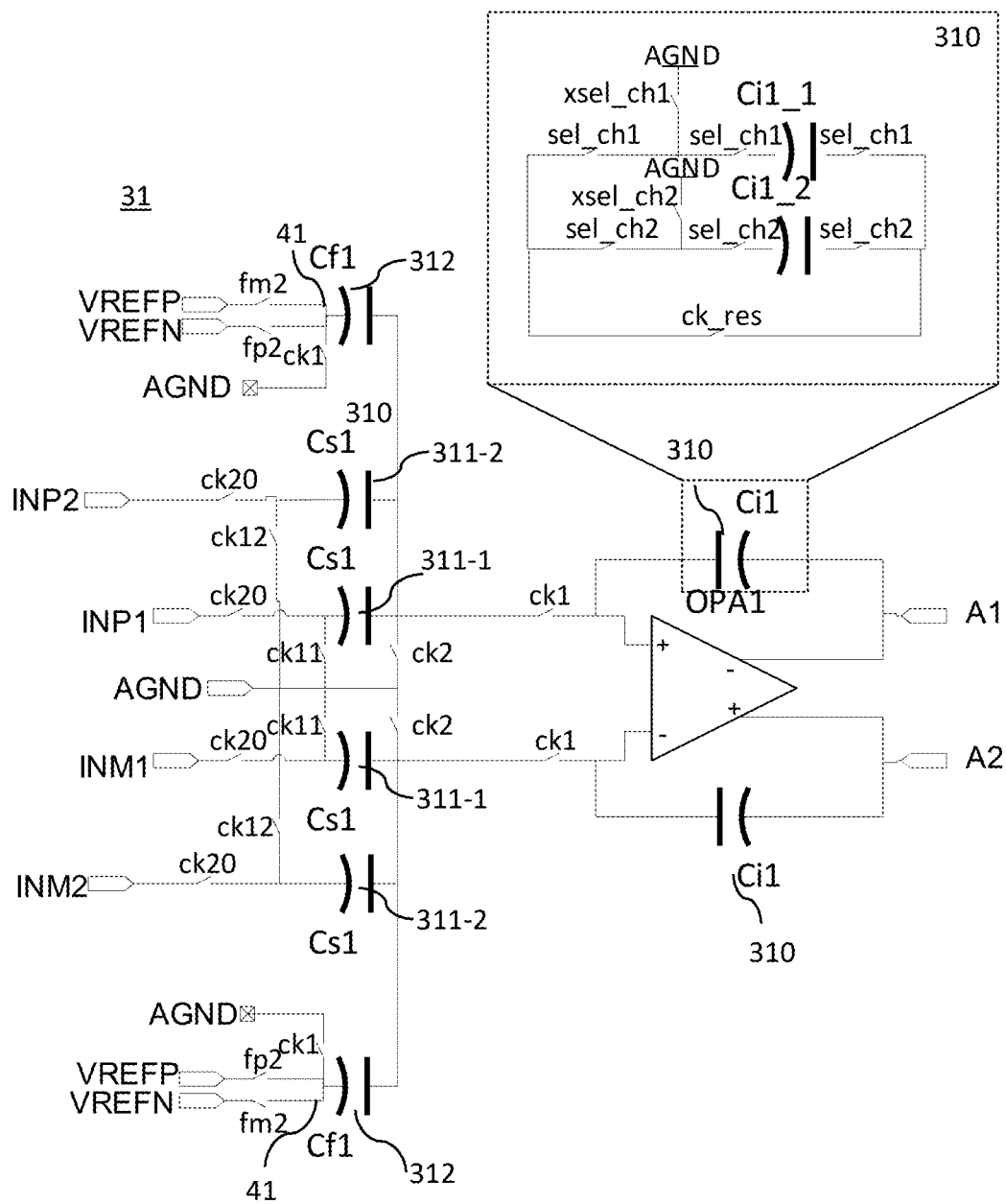
FIGS. 11A to 11E show a circuit diagram of a third-order two-channel multiplexing SDADC according to a first exemplary embodiment.
Figure 11B:
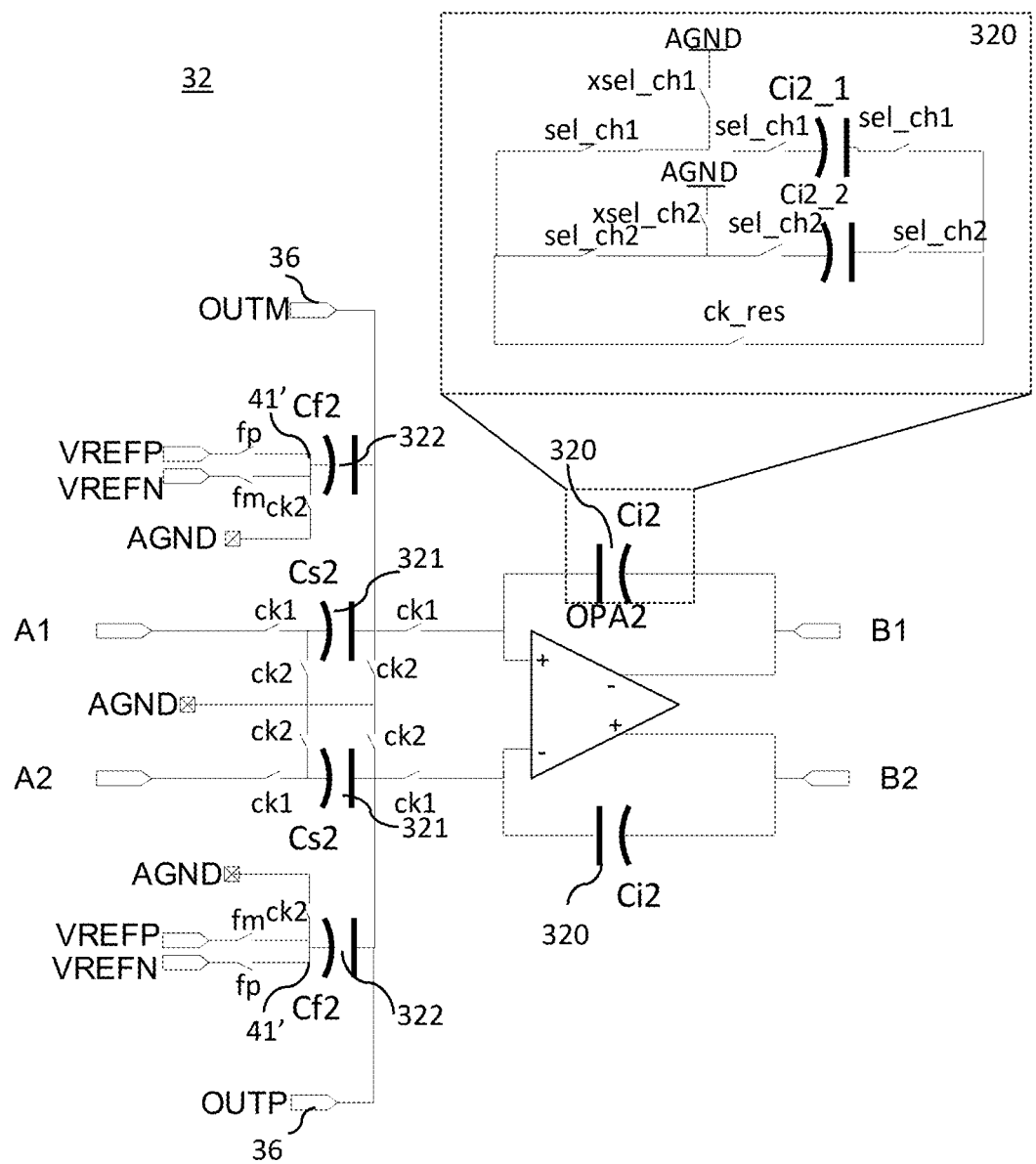
Figure 11C:
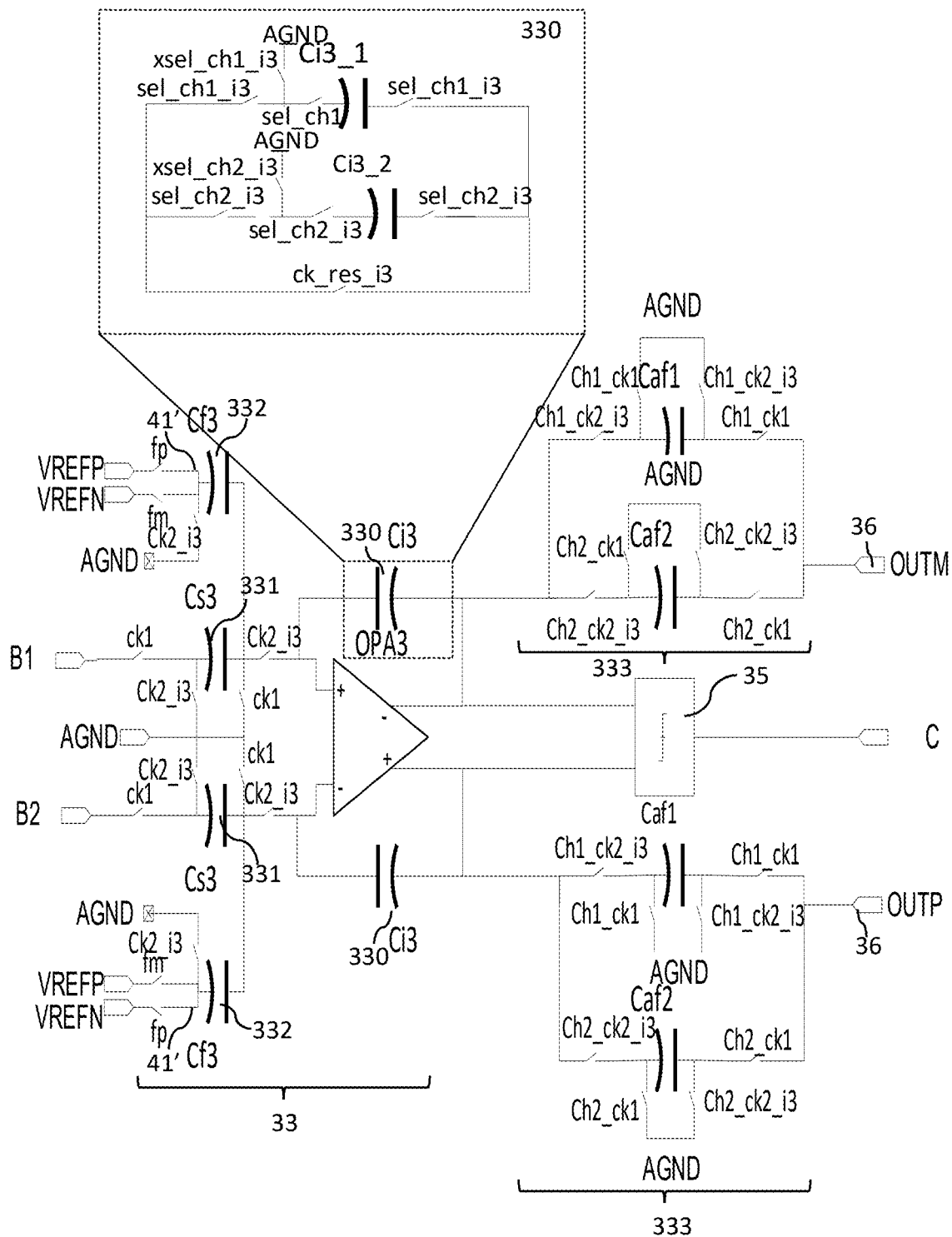
Figure 12:
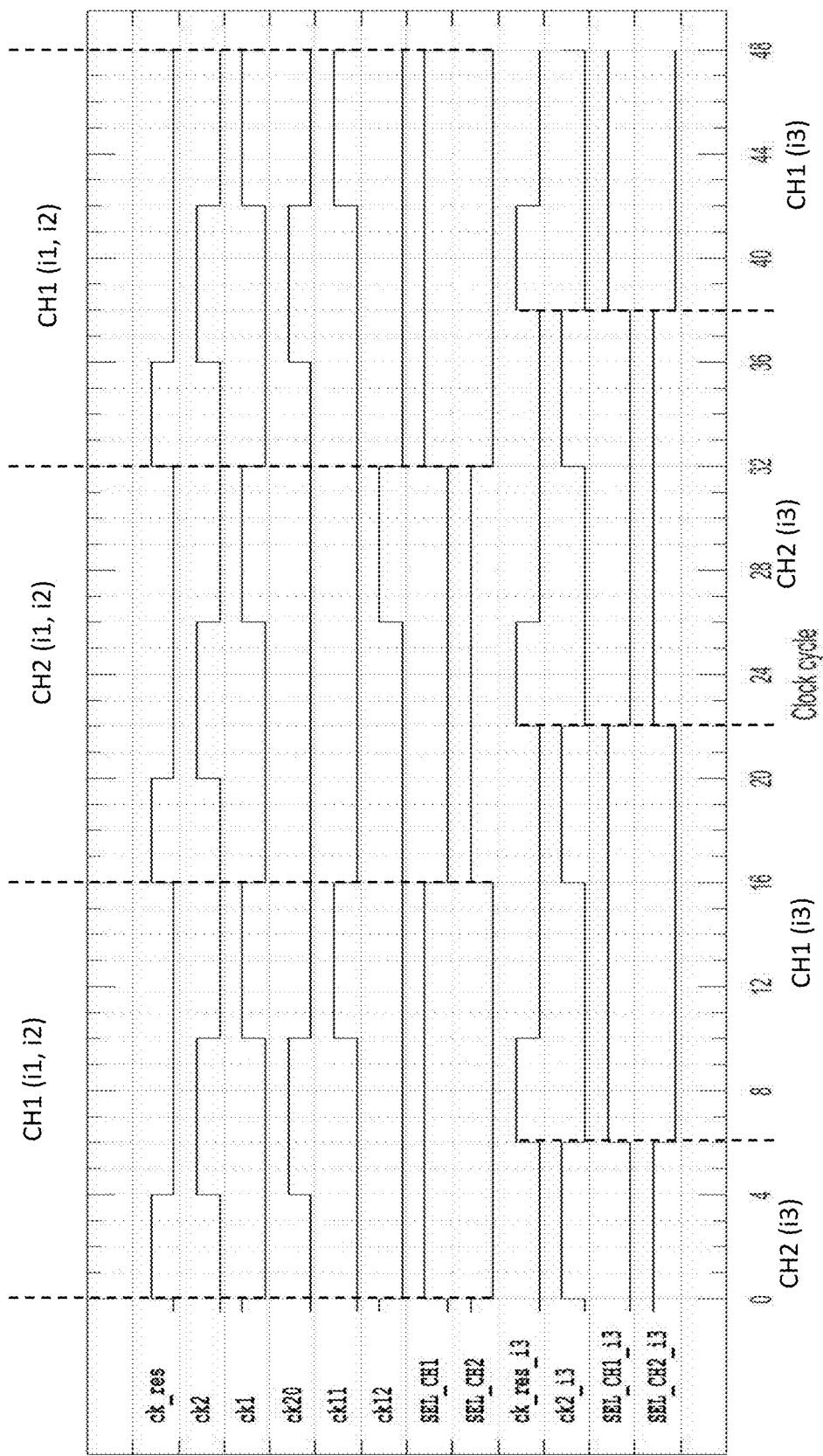
FIG. 12 illustrates clock cycles of SDADC according to the first exemplary embodiment.

As shown in FIGS. 11A to 11C, integrating capacitor circuitries Ci1 (310), Ci2 (320) and Ci3 (330) are shown in the main circuit diagram as a single capacitor(s) for clarity reasons, while actual circuitry thereof with parallel capacitors and a switching arrangement that enables channel multiplexing is shown in an enlarged view of the respective integrating capacitor circuitry (310, 320, 330) provided in each respective figure. In these examples, two multiplexed channels are disclosed, but number of multiplexed channels could be higher, which can be handled for example by adding further parallel capacitors and switching arrangements in the integrating capacitor circuitries (310, 320, 330) as well as other capacitor circuitries in the design.

FIG. 11A shows circuit diagram of the first integrator (31) that handles double-ended input signals INP1, INM1 and INP2, INM2. In a corresponding single-ended system, there would be two input signals IN1 and IN2. The first integrator (31) in the modulator is a delaying integrator, and it takes simultaneously in parallel samples from two input channels at sampling clock ck20. The charges are stored to two sampling capacitor sets Cs1 (311-1, 311-2) and at the same time feedback capacitor sets Cf1 (312) are charged accordingly with a charge determined by a former output of the modulator of the respective first or second channel. Resetting the first feedback line (41) feeding back the first integrator (31) occurs right after the reset period controlled by the reset clock (ck_res) to avoid mixing feedback between the first and second channels, here implemented with ck2. Next charges from the first channel sampling capacitor sets Cs1 (311-1) holding the first channel input (INP1, INM1) is delivered to the integrator after which the first operational amplifier (OPA1) is reset and channel is switched and the charge from the second channel sampling capacitor sets Cs1 (311-1) holding the second channel input (INP2, INM2) is delivered to integrator and the first operational amplifier (OPA1) is reset again, after which the cycle repeats.

Enlarged view of the integrating capacitor circuitry (310) shows capacitors (Ci1_1, Ci1_2) and switching arrangement that enables channel multiplexing by alternately coupling one of the channels with the first operational amplifier (OPA1) of the first integrator (31) based on the first channel selection clock set (sel_ch1, sel_ch2), and resets the first operational amplifier (OPA1) between channels on the reset clock cycle (ck_res).

Moreover, output signals (A1, A2) form the first integrator are input in the second integrator (32) shown in FIG. 11B, which is a non-delaying integrator, also referred to as the first non-delaying integrator, since it is the first integrator of this type in the integrator chain. As understood by a skilled person, in a single-ended apparatus, there is just a single output signal from the first integrator (31). The second integrator (32) has a single sampling capacitor set Cs2 (321), since different channels are received at the input at different times, as well as a single feedback capacitor set Cf2 (322). The feedback capacitor set Cf2 (322) is charged accordingly with a charge determined by a preceding output of the modulator of the respective first or second channel. Resetting the first feedback line (41) feeding back the second integrator (32) occurs right after the reset period controlled by the reset clock (ck_res) to avoid mixing feedback between the first and second channels. The resetting of the first feedback line (41) is controlled with ck2. A parallel capacitor and switching arrangement implementing integrating capacitor circuitry Ci2 (320) enables channel multiplexing by alternately coupling one of the channels with the second operational amplifier (OPA2) of the second integrator (32) based on the first channel selection clock set (sel_ch1, sel_ch2), and resets the second operational amplifier (OPA2) between channels on the reset clock cycle (ck_res). In a single-ended system, there is just one integrating capacitor circuitry (320) whereas in the double-ended system as shown in the example, there are two integrating capacitor circuitries (320). Output signals (B1, B2) from the second integrator are input to the third integrator (33) shown in FIG. 11C, which is a delaying integrator and can also be referred to as the second delaying integrator. Like in the first delaying integrator, if the system is single-ended, a single output signal is produced by the second delaying integrator.

FIG. 11C shows circuit diagram of the second delaying integrator (33) in the modulator, which takes sample from input(s) at ck1 and moves the sample forward at ck2_i3. The charge sample is stored to the sampling capacitor set Cs3 (331) and at the same time feedback capacitor set Cf3 (332) is charged accordingly with a charge determined by a former output of the modulator of the respective first or second channel. The charge from the second feedback line (41') is moved to the third integrator in clock ck2_i3 phase. Although not visible from the clocking diagram, the feedback line (41') is coupled to analog ground (AGND) with clock ck2_i3 just after resetting the first and second integrators (31, 32) by clock ck_res, which is unique to the third integrator (33) to ensure correct timing of feedback and to avoid mixing channel information. The second feedback line (41') feeding back the third integrator (31) is grounded just before the reset period controlled by the third integrator's reset clock (ck_res_i3). A parallel capacitor and switching arrangement implementing integrating capacitor circuitries Ci3 (330) enables channel multiplexing by alternately coupling one of the channels with the second operational amplifier (OPA3) of the integrator (33) based on the second channel selection clock set (sel_ch1_i3, sel_ch2_i3), and resets the third operational amplifier (OPA3) between channels on the reset clock cycle (ck_res_i3). In this third order SDADC, output of the second delaying integrator (33) is fed to the single-bit ADC (35) for obtaining a digital signal C that is fed forward to digital circuitry shown in FIG. 11D.

The first and second integrating capacitor circuitries (310, 320) use mutually the same first channel selection clock set (sel_ch1, sel_ch2) and common first reset clock (ck_res) for resetting operational amplifiers (OPA1, OPA2). Multiplexing is enabled by alternately coupling either of the channels with the respective operational amplifier (OPA1, OPA2 in FIGS. 11A and 11B) of the respective integrator (31, 32) based on the channel selection clock set (sel_ch1, sel_ch2). The third integrating capacitor circuitry (330) uses a second channel selection clock set (sel_ch1_i3, sel_ch2_i3) and a second reset clock (ck_res_i3) for resetting operational amplifier (OPA3). Channel selection clocks of the second channel selection clock set (sel_ch1_i3, sel_ch2_i3) are delayed from respective channel selection clocks of the first channel selection clock set (sel_ch1, sel_ch2) preferably by less than a half of a full lock cycle determined by two consecutive first reset clocks, and more than duration of a reset period determined by the first reset clock (ck_res). Preferably, sel_ch1_i3 is delayed by the duration of ck2_i3, because ck2_i3 is used for controlling transfer of the charge of the respective channel, which was controlled by the sel_ch1 and sel_ch2 clocks.

FIG. 11C further shows a local feedback circuitry (333) for generating the local feedback signal (36). The local feedback circuitry (333) comprises local feedback capacitors (Caf1, Caf2) and switching arrangement controlled with both clock signals used by the first and second integrators (31, 32) and clock signals used by the third integrator (33) to avoid mixing up feedback signal between the two channels. In a double-ended design as shown in FIG. 11C, there are two local feedback circuitries (333), while in a single-ended design (not shown), there is a single local feedback circuitry (333). In both cases, the local feedback circuitry comprises as many parallel local feedback capacitors (Caf1, Caf2, . . . CafN) as there are multiplexed channels. As understood by a skilled person, local feedback is optional. The SDADC is fully functional without it, but local feedback can be implemented to improve the noise transfer function as explained above. Local feedback is generated based on the analog signal that is output from the last integrator in the integrator chain. In this embodiment, the local feedback signal (36) is fed in the input of the first non-delaying integrator, which is the second integrator (32) in the integrator chain, and which can also be referred to as the first integrator in the integrator chain after the first delaying integrator (31).

Figure 11D:
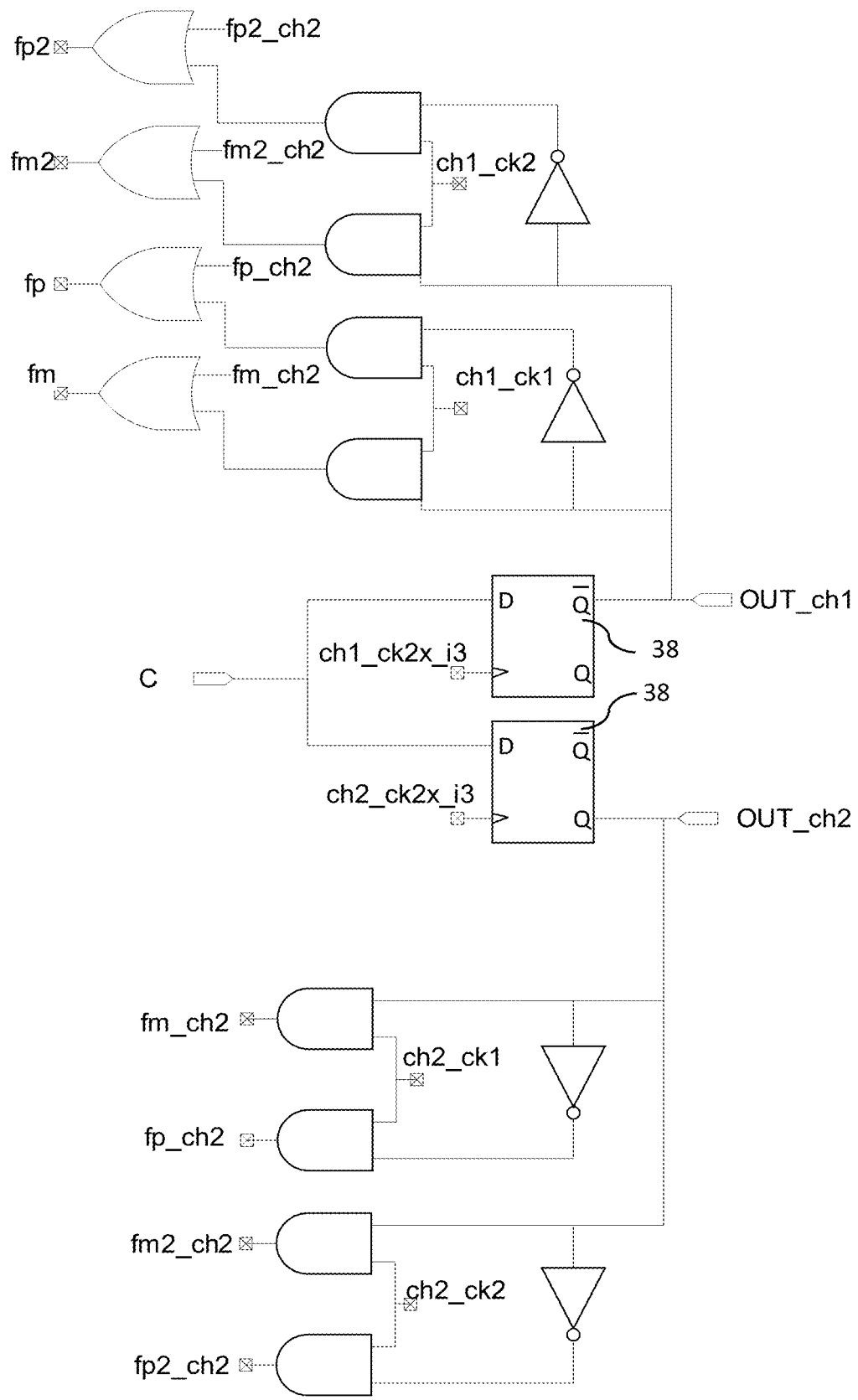

FIG. 11D is a circuit diagram of digital circuitry of the SDADC. Input (C) from the ADC (35), in this example a single-bit ADC implemented by a comparator, is received one channel at a time and read to a respective output register (38). The digital output signal (OUT_ch1, OUT_ch2) is also fed through digital circuitry that comprises logic ports for generating feedback signals (41, 41') for both channels.

Figure 11E:
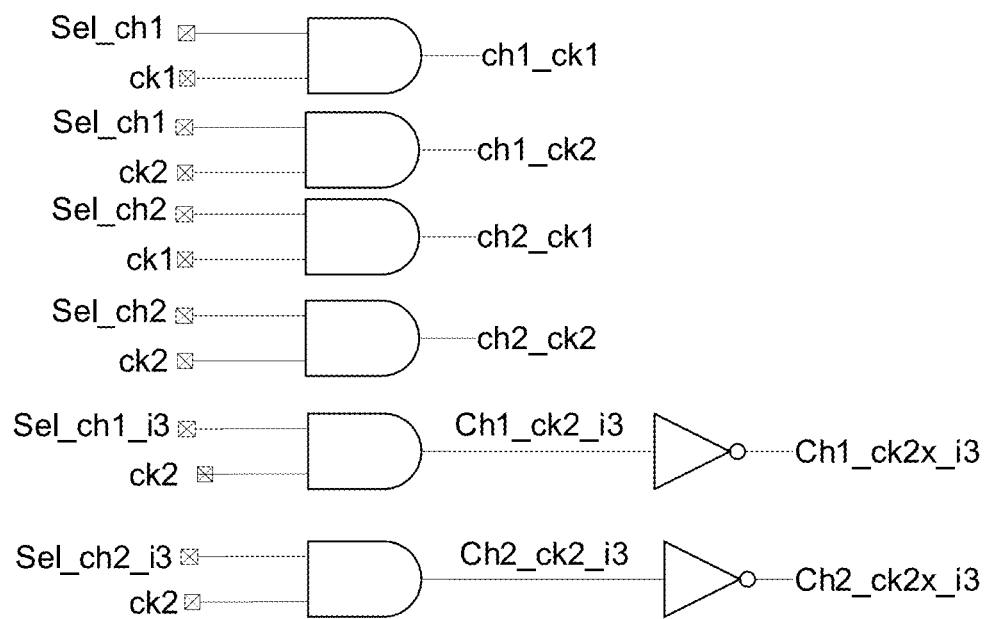

FIG. 11E shows that reset is beneficially performed between adjacent ck2/1 sets even if the integrator is processing the same channel multiple times before moving to next channel. This is due to fact that any periodic error sourced in modulator loop might cause idle tones and dead zone-like behavior. The reset allows keeping switch control transitions identical at all times.

Operation of the modulator is described here in simplified manner, as if the modulator was single-ended, but the same principle applies to a double-ended modulator shown in the drawings.

During sample clock ck20 the modulator stores in parallel samples of two different input signals to first channel sampling capacitors sets Cs1 (311-1, 311-2) of the first integrator (31) and at the same time first integrator's (31) modulator feedback capacitor set Cf1 (312) is charged according to last binary output (VREFP, VREFN) of the corresponding channel. During next clock ck1 charge from the one of the sampling capacitor sets Cs1 (311-1) of the first integrator (31) is delivered through the first integrator (31) on ck11, and through second integrator's (32) sampling capacitor set Cs2 (321) as well as through second integrator (32) and stored finally to third integrator's sampling capacitor set Cs3 (331). The sampling capacitor sets Cs1 (311) can also be considered as sampling capacitor sets of the entire modulator.

During the same clock ck1, three other tasks are being performed simultaneously: i) the charge driven through second integrator's (32) modulator feedback capacitor set Cf2 (322) and the second integrator (32) is stored into the sampling capacitor set Cs3 (331) of the third integrator (33), ii) the third integrator's (33) modulator feedback capacitor set Cf3 (332) is charged equivalently, and ii) to implement local feedback the delayed third integrator's output (36) stored in local feedback capacitor circuitry (333) is moved to second integrator's (32) integrating capacitor circuitry Ci2 (320) and further stored to sampling capacitor set Cs3 (331) of the third integrator (33). As shown in FIG. 11C, the local feedback capacitor circuitry (333) is also implemented as a switched capacitor arrangement for enabling appropriate channel selection for multiplexing. Parallel capacitors of the switched capacitor arrangement operate as memory elements for storing charge of one channel while the other channel is being processed by the operational amplifier of the second integrator.

Timing of the local feedback signal (36) is implemented such that storing the local feedback charge in the local feedback capacitor circuitry (333) is controlled in dependence of the first clock set and feeding back the local feedback is controlled in dependence of the second clock set.

As illustrated from clock timing table of FIG. 12, the next phase for the first and second integrators (31, 32) would be the reset phase which indicates that the third integrator (33) can't use the same clocks as the first two integrators (31, 32). This problem has been solved by designated clocks for the third integrator (33). These third integrator specific clocks, comprising the third integrator clock ck2_i3, third integrator reset clock ck_res_i3, and the second channel selection clock set (SEL_CH1_i3, SEL_CH2_i3), are identified in the figures with suffix "_i3". Such third integrator specific clocks make it possible that even though first and second integrator (31, 32) are reset, the third integrator clock ck2_i3 passes the charge from the third sampling capacitor set Cs3 (331) and the third feedback capacitor set Cf3 (332) to the third integrator's (33) integrating capacitor circuitry Ci3 (330). At falling edge of the third integrator clock ck2_i3 the ADC (35) output is stored to the registers (38) controlling outputs of the SDADC. Resetting the second feedback line (41') feeding back the third integrator (33) is controlled by the third integrator clock ck2_i3, and this occurs simultaneously with resetting the first and second integrators (31, 32) by first reset clock ck_res. For enabling two separate output signals (OUT_ch1, OUT_ch2) to be provided in parallel, two flipflops are provided as registers (38), one for each channel. These registers also enable feedback after a logic combination shown in FIG. 11D.

Output of the third integrator (33) is also used for the local feedback to the second integrator's (32) input, but since these two integrators have different clocking schemes the local feedback needs to be delayed. For this reason, the local feedback capacitor circuitry (333) comprising the parallel local feedback capacitors (Caf1, Caf2), uses clock Ck2_i3 in the third integrator's (33) side and clock Ck1 at the second integrator's (32) input side. Because of this timing difference in local feedback, parallel local feedback capacitors are provided in the local feedback capacitor set to handle correct timing of local feedback signal of the multiplexed channels. Local feedback capacitors (Caf1, Caf2) are typically the smallest capacitors in the modulator and therefore the parallel local feedback capacitor set has minimal impact to area of the circuitry compared with just one pair. The local feedback signal (36) is fed in the input of the first non-delaying integrator, which is the second integrator (32) in the integrator chain, which can also be referred to as the first integrator in the integrator chain after the first delaying integrator (31).

There is still a charge representing input signal value of the other channel stored in one of the first integrator's sampling capacitor sets Cs1 (311), for which similar operation is performed. Since the clocking scheme of the third integrator (33) is changed, the channel would also be switched from the second channel to the first channel before handling the second channel through the whole modulator. Therefore, new and separate second channel selection clocks (SEL_CH1_i3, SEL_CH2_i3) are provided for the third integrator (33). Another reason for the second channel selection clocks (SEL_CH1_i3, SEL_CH2_i3) is that each channel should always be reset first, and this significantly limits the possibilities of a functional clocking scheme.

The same operation principle can be applied also to multiplex more than two channels, for example three or four channels. In such case, number of parallel sampling capacitor sets Cs (311) of the first integrator (31), number of parallel integration capacitors Ci (310, 320, 330) of the integrators (31, 32, 33) and number parallel capacitors in the local feedback capacitor sets (333) should equal the number of multiplexed channels, thus being a positive integer that is at least two. Also, number of output registers (38) preferably equals the number of multiplexed channels.

According to a second exemplary embodiment, the modulator implementation is otherwise like in the first embodiment but now instead of sampling two different channels at the same time instant, the same input is sampled to both sets of sampling capacitors Cs1 (311). As in the first embodiment, the first integrator (31) and the third integrator (33) are delaying while the second integrator (32) is non-delaying.

Figure 13A:
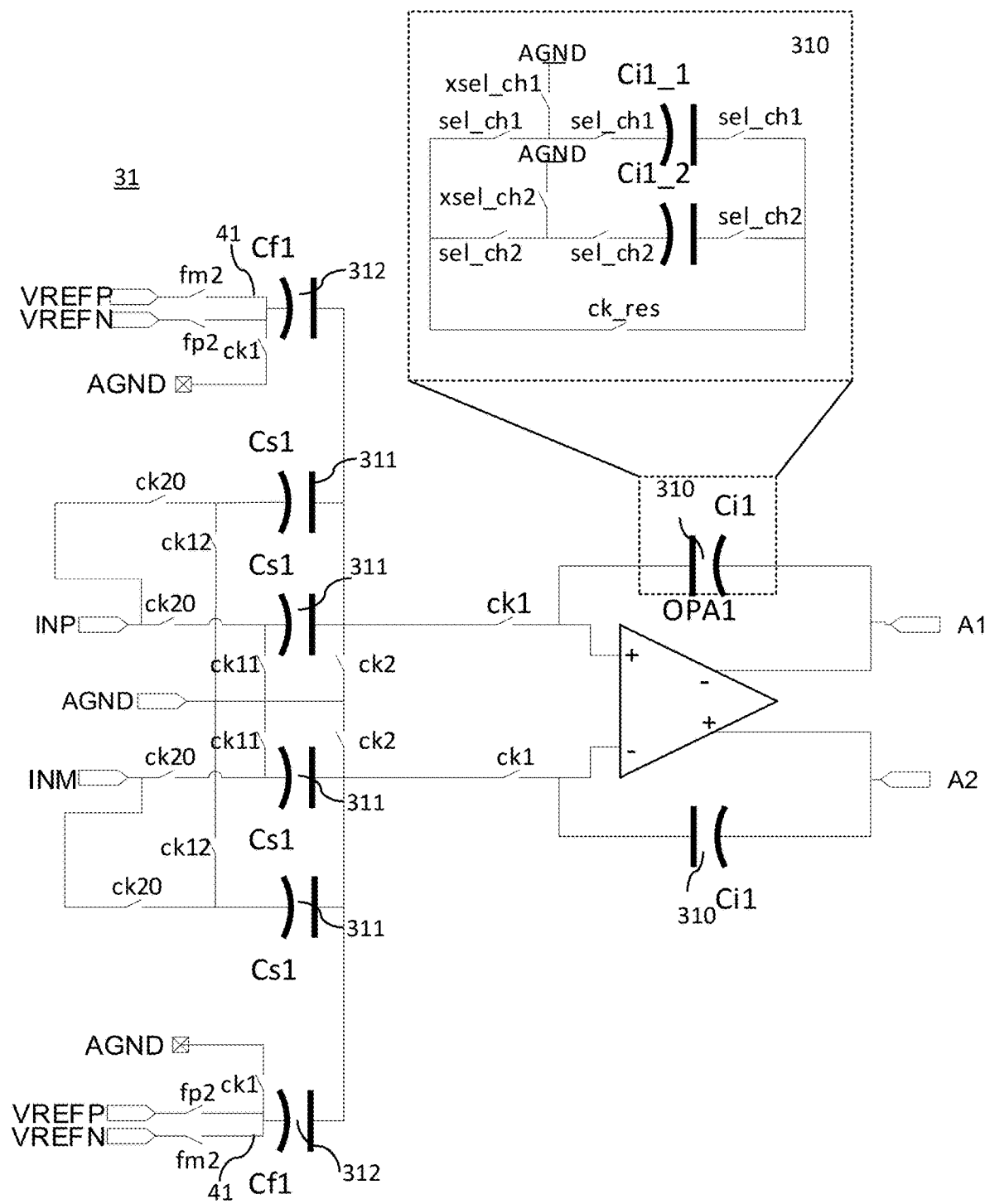
FIGS. 13A to 13C show a circuit diagram of an SDADC according to the second exemplary embodiment.
Figure 13B:
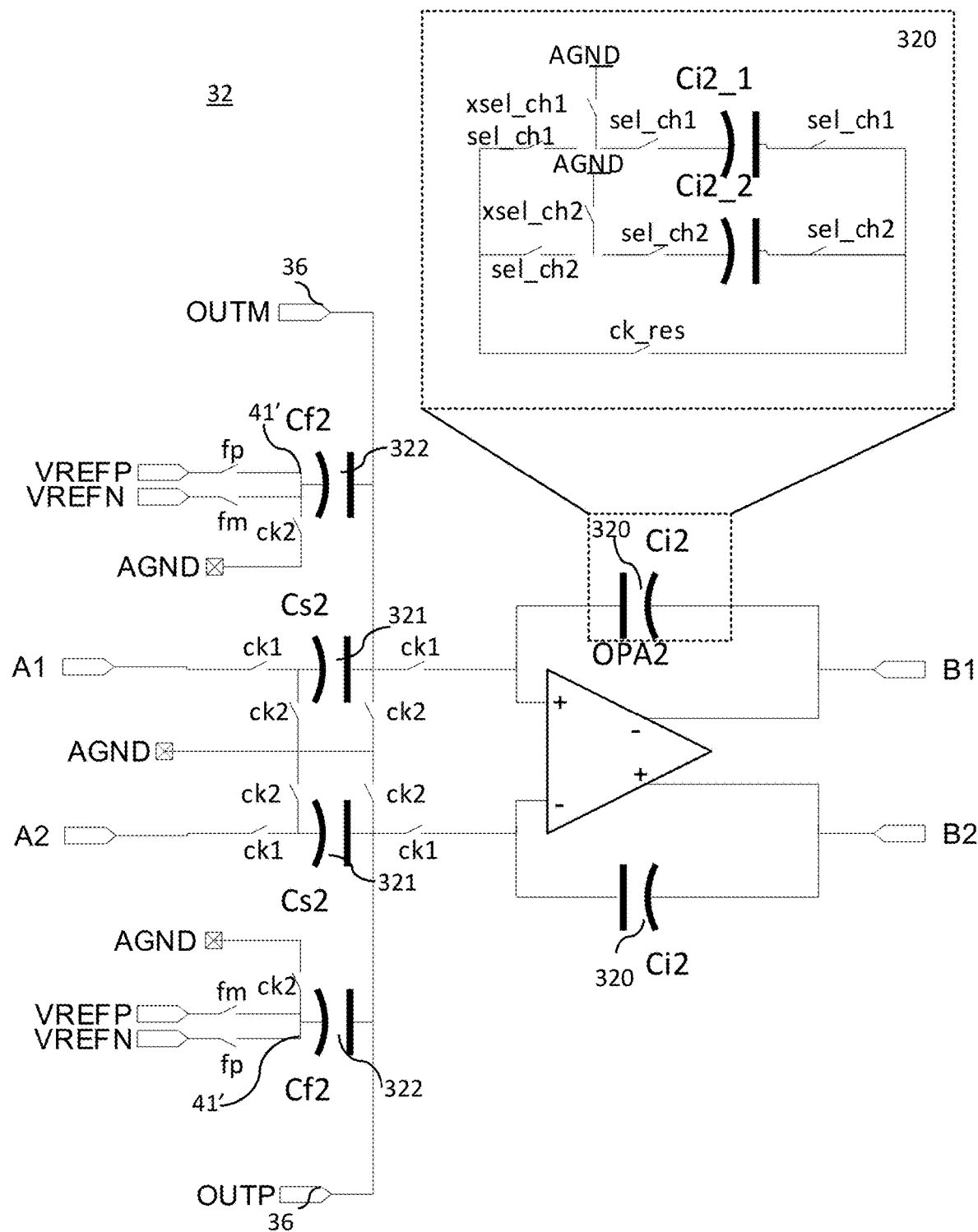
Figure 13C:
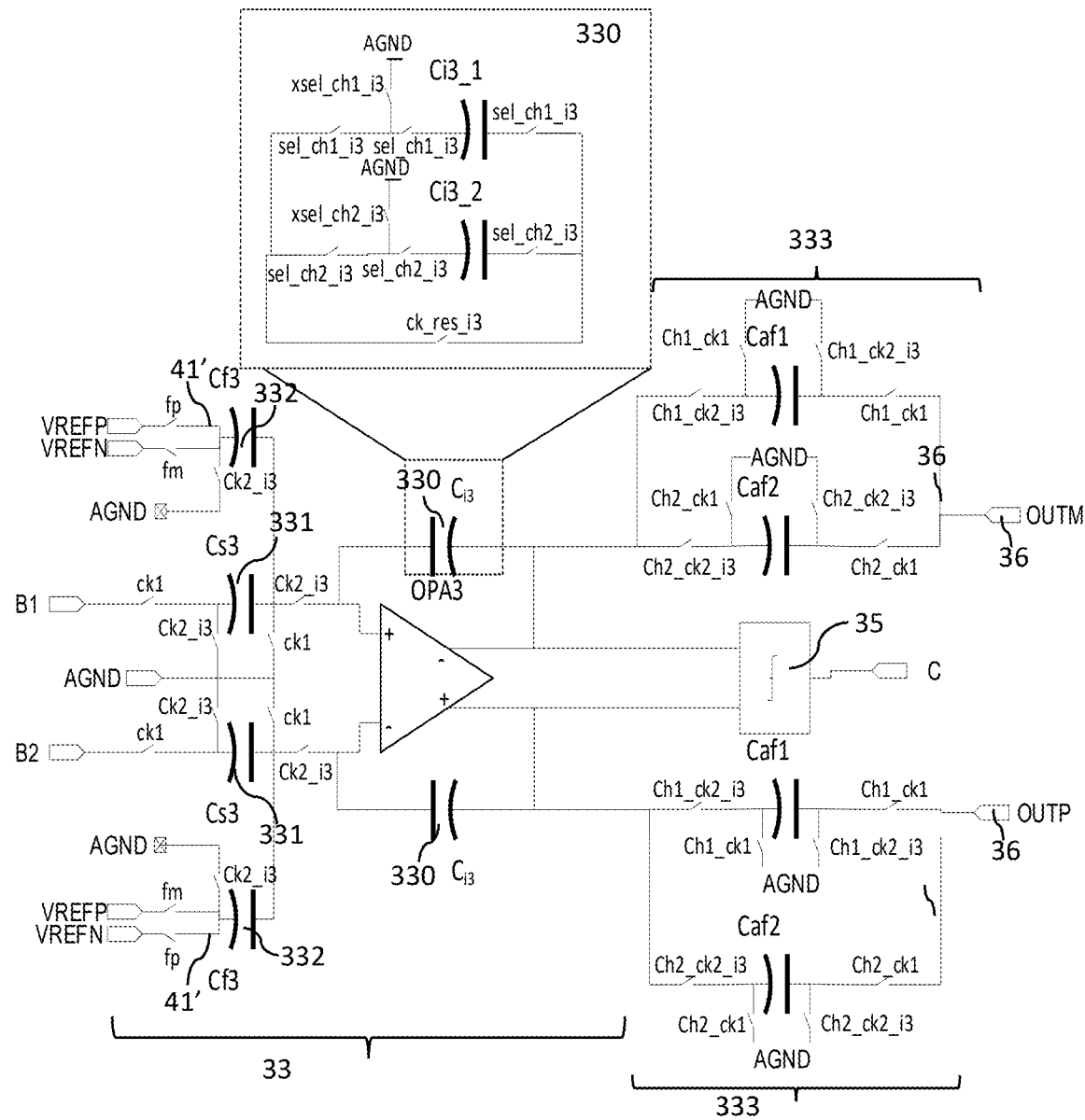
Figure 14:
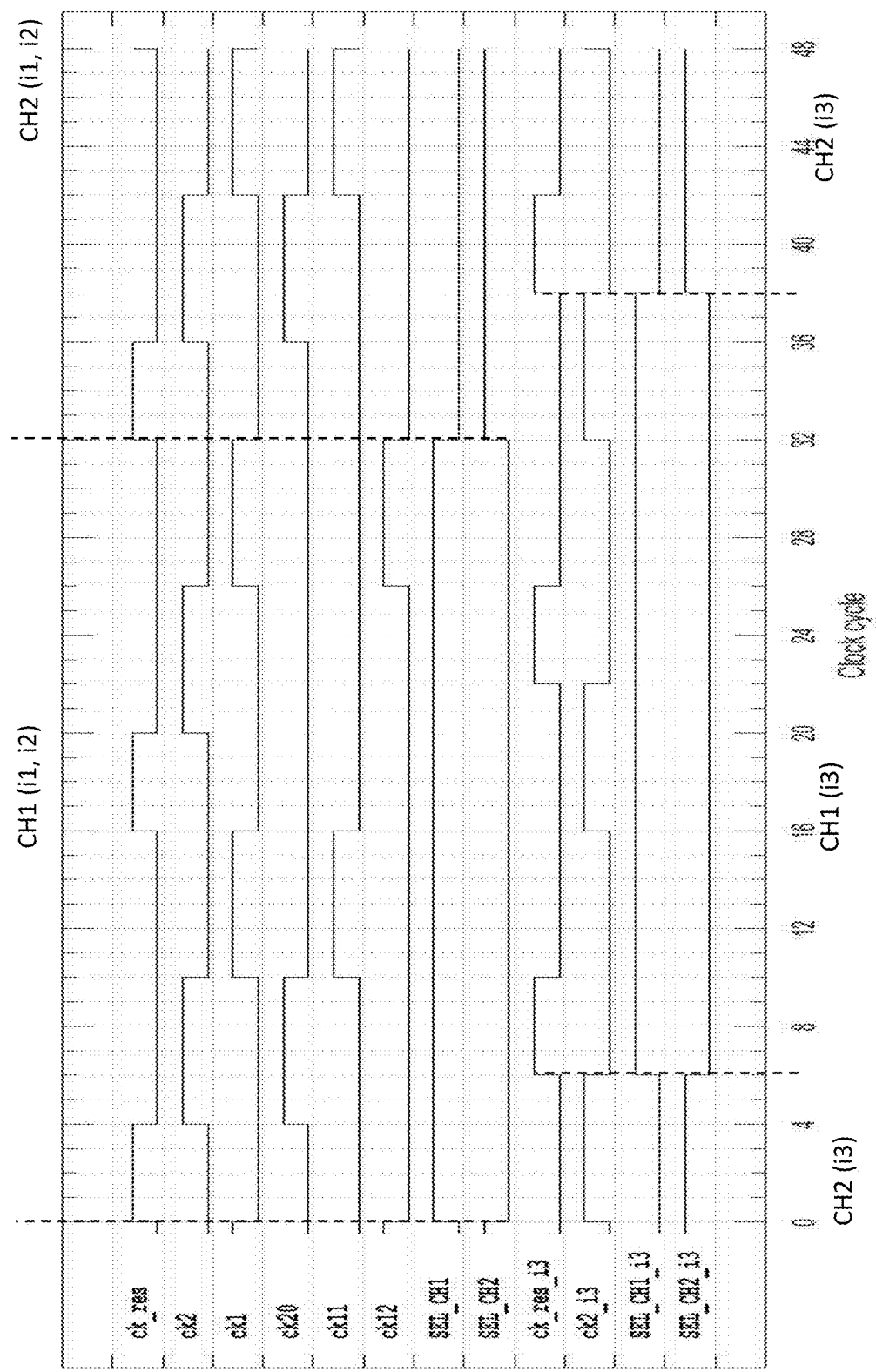
FIG. 14 illustrates clock cycles of the SDADC according to the second exemplary embodiment.

FIGS. 13A to 13C show circuit diagram of an SDADC according to the second embodiment. Digital circuitries shown and described in connection with FIGS. 11D and 11E are applicable also with the second embodiment and are therefore not unnecessarily repeated. A timing diagram of clocks used in the following description of operation of the circuitry is shown in FIG. 14.

In FIGS. 13A to 13C, integrating capacitor circuitries Ci1 (310), Ci2 (320) and Ci3 (330) are shown in the main circuit diagram as single capacitors for clarity reasons, while actual circuitry implementation with applicable parallel capacitors and switching arrangement that enables channel multiplexing is shown in an enlarged view of the respective integrating capacitor provided in each figure. These integrating capacitor circuitries (310, 320, 330) implement a feedback functionality within the respective integrator.

Input signal charges of the two samples of the same input signal are moved at different time instant, which effectively implements a doubled sampling frequency. This allows the modulator to have double data rate compared to input signal, which improves quantization noise shaping and increases bandwidth. In this embodiment, input signals (INP, INM) for different channels arrive at different time instant determined by the first channel selection clock set (SEL_CH1 & SEL_CH2) and sampling clock ck20 comprised in the first clock set. Multiplexing is implemented by sampling the other input channel after both samples of the previous input channel have been moved forward form the sampling capacitor set Cs1 (311) for handling by the modulator circuitry.

During sample clock ck20 the two samples of the same input signal is stored to sampling capacitor set Cs1 (311) of the first integrator (31) and at the same time feedback capacitor Cf1 (312) of the first integrator (31) is charged according to last binary output (VREFP, VREFM) of the corresponding channel. During next clock ck1, charge from one of the first integrator's (31) and thus also the modulator's sampling capacitor sets Cs1 (311) is delivered through the first integrator (31) on ck11, and through second integrator's (32) sampling capacitor set Cs2 (321) as well as through second integrator (32) and stored finally to third integrator's sampling capacitor set Cs3 (331).

During the same clock ck1, three other tasks are being performed simultaneously: i) the charge driven through second integrator's (32) modulator feedback capacitor set Cf2 (322) and the second integrator (32) is stored into the sampling capacitor set Cs3 (331) of the third integrator (33), ii) the third integrator's (33) modulator feedback capacitor set Cf3 (332) is charged accordingly, and ii) to implement the optional local feedback the delayed third integrator's (33) output OUTM, OUTP (36) stored in the local feedback capacitor circuitry (333) is moved to second integrator's (32) integrating capacitor set Ci2 (320) and further stored to sampling capacitor set Cs3 (331) of the third integrator (33). Like in the first embodiment, the local feedback capacitor circuitry (333) is also implemented as a switched capacitor arrangement for enabling appropriate channel selection for multiplexing. As can be seen from the schematics 13A, 13B and 13C, the same two feedback signals VREFP and VREFN used for both feedback lines (41, 41'), but there is a difference on timing of feedback. In other words, different clocks are used to control when the feedback signal is received by the integrators. For the first integrator (31) feedback line (41) is controlled by clocks fm2 and fp2, whereas feedback to the second integrator (32) and the third integrator (33) is controlled by clocks "fp" and "fm".

Timing of the local feedback signal (36) is implemented such that storing the local feedback charge from output of the third integrator (33) in the local feedback capacitor circuitry (333) is controlled in dependence to the second channel selection clock set associated with the third integrator (33) and feeding back the local feedback to second integrator (32) is controlled in dependence of the first channel selection clock set associated with the first and second integrators (31, 32).

As illustrated from clock timing table of FIG. 14, the next phase for the first and second integrators (31, 32) would be the reset phase which indicates that the third integrator (33) can't use the same clocks as the first two integrators. This is a similar problem as already discussed in connection to the first embodiment and has been solved in the similar manner by designated clocks for the third integrator as already explained above. For enabling two separate output signals to be read in parallel, two flipflops are provided as registers (38), one for each channel. These registers also enable feedback after the logic combination shown in FIG. 11D.

Output of the third integrator is also used for the local feedback to the second integrator's (32) input but since these two integrators have different clocking schemes the local feedback needs to be delayed as explained above. For this reason, the local feedback capacitor set (333) uses clock Ck2_i3 in the third integrator (33) side for controlling switches of the local feedback capacitor set (333) and Ck1 at the second integrator's (32) input side.

There is still a charge, in other words a second sample of the same input signal, stored in one of the first integrator's sampling capacitor set Cs1 for which same operation is performed. Since the clocking scheme of the third integrator (33) was changed from that of the first and second integrators (31, 32), the channel would also be switched from the first channel to the second channel before handling the second sample of the first channel through the whole modulator. Therefore, separate channel selection clock set (SEL_CH1_i3, SEL_CH1_i3) is provided for the third integrator (33). Another reason for separate channel selection clock set (SEL_CH1_i3, SEL_CH2_i3) is that each channel should be always reset first, and this significantly limits the possibilities of a functional clocking scheme. Next, the same exact operation is performed for the second channel starting from double sampling the input.

The same operation principle providing double data rate (two bits per sample) can be applied also to multiplex more than two channels in the second embodiment. However, contrary to the first embodiment, there is no requirement to add number of parallel switched capacitors in any of the integration circuitries (310, 320, 330) or local feedback circuitries (333) to handle more channels, since two samples of the same input are performed for each channel, one at a time. Number of output registers (38) should equal the number of multiplexed channels. In some embodiments, number of parallel switched capacitors in the integration and local feedback circuitries can be increased for further increasing number of parallel samples taken and handled from each individual channel, such that the modulator would have more than double data rate compared to input signal, which would further improve quantization noise shaping and increase bandwidth. However, oversampling does not require additional input capacitors if the input voltage is available at modulator channel bit rate or continuously. In this case ck2 will replace ck20 and ck1 will replace ck11, while only one sampling capacitor set Cs1 is needed.

FIG. 14 illustrates clock cycles of the SDADC according to the second embodiment. FIG. 14 also shows the mutual temporal association between various clocks of the first clock set and similarly between various clocks of the second clock set. Channel selection clocks can be considered to extend over two full clock cycles. Each full clock cycle has a length equal to duration between two resets: ck_res in the first clock set and ck_res_i3 in the second clock set. In comparison to the first embodiment, main difference is that processing each channel is performed during two consecutive clock cycles to have both input samples taken to be processed separately before moving on to handling two samples of the other channel. Thus, duration of channel selection clocks (SEL_CH1, SEL_Ch2; SEL_CH1_i3, SEL_CH2_i3) in both clock sets is doubled from that in the first embodiment.

FIGS. 15A to 15D illustrate a third exemplary embodiment of the invention. The basic circuitry is similar to that of the first embodiment, but an improved clocking scheme is used.

Figure 15A:
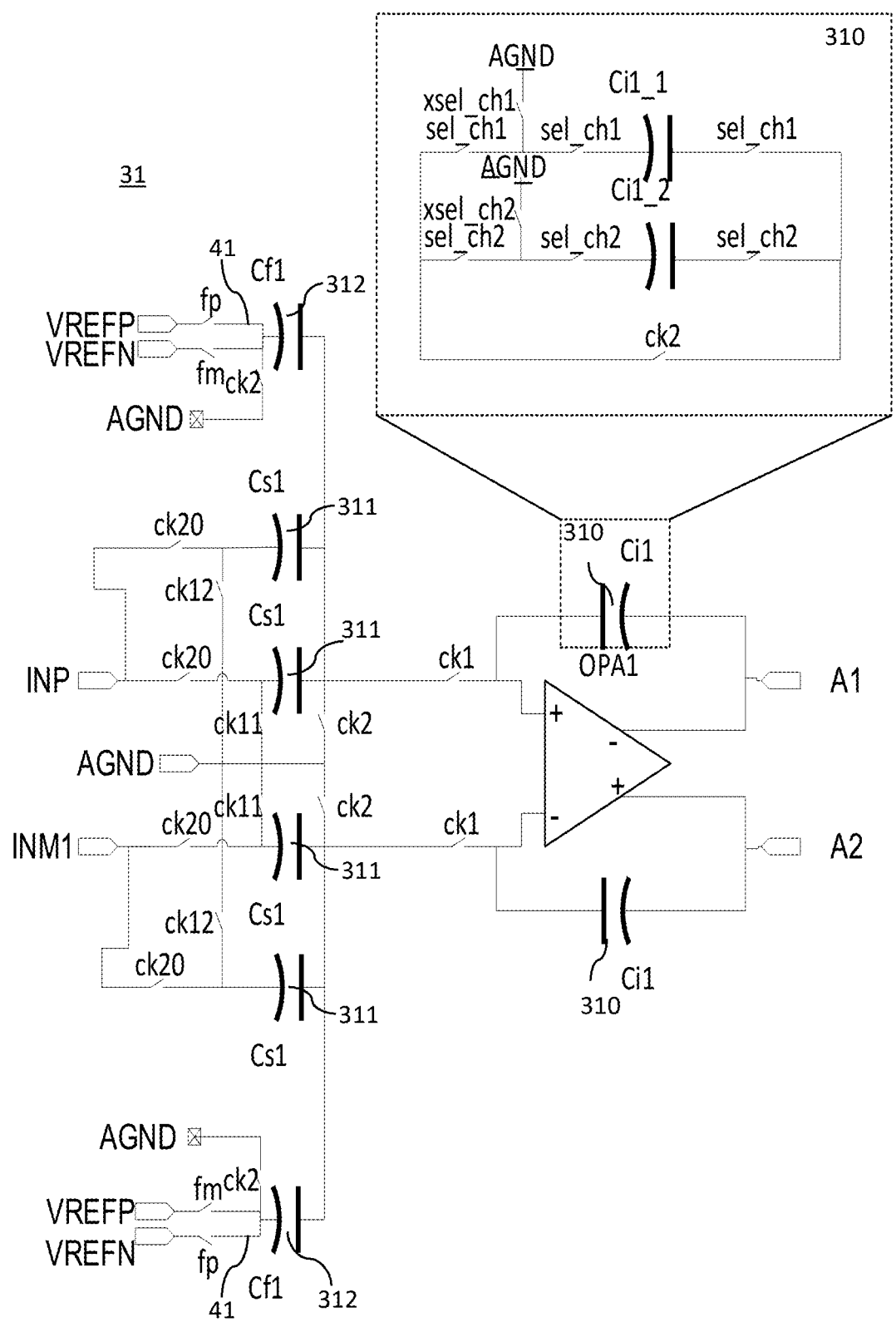
FIGS. 15A to 15D show a circuit diagram of an SDADC according to the third exemplary embodiment.

FIG. 15A shows a circuit diagram of sampling capacitors (311) of the SDADC and the first integrator (31), corresponding to that of the second embodiment except for clocking. Dedicated reset clock (ck_res) is replaced with ck2 in the first integrating capacitor circuitry (310).

Figure 15B:
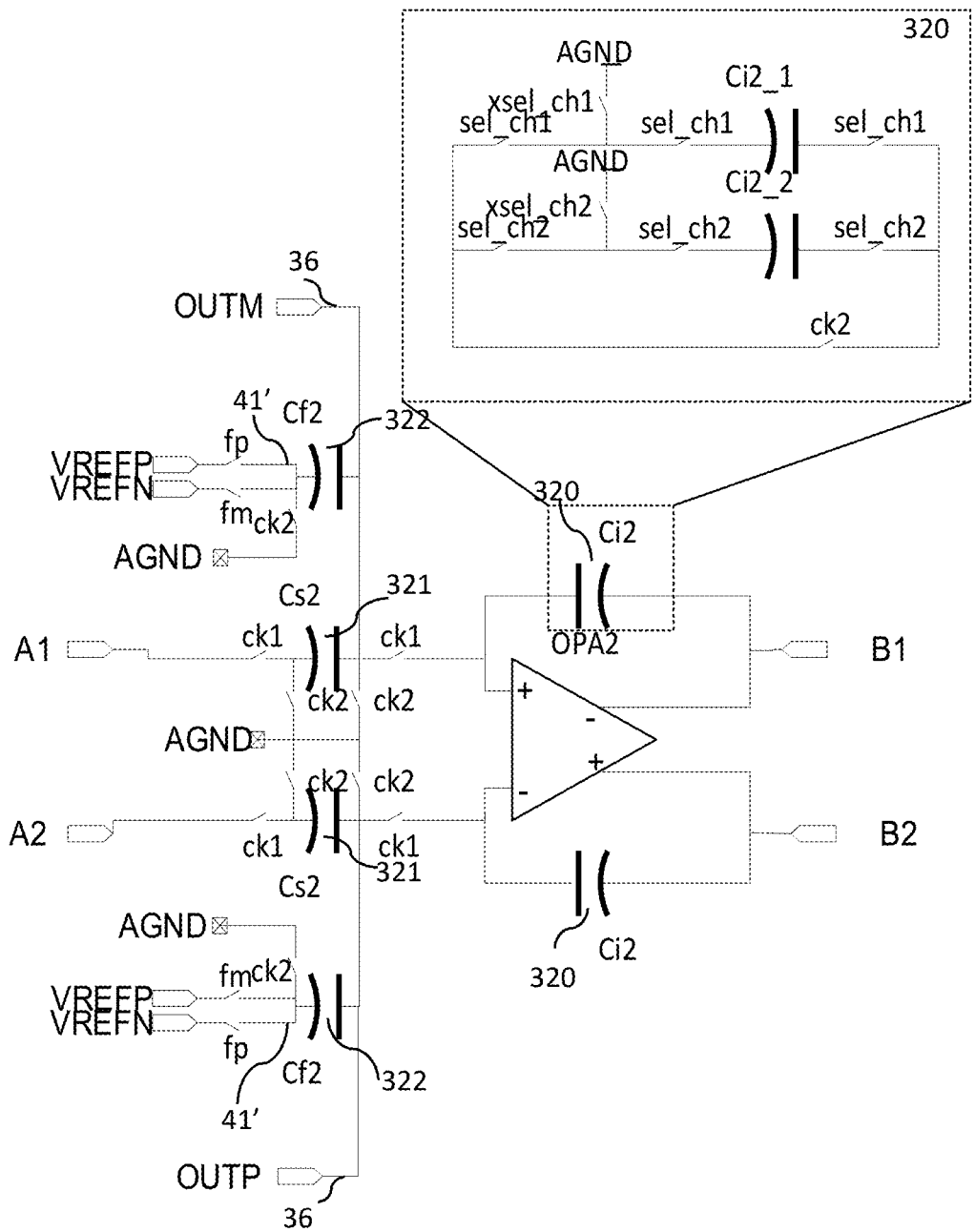

FIG. 15B shows a circuit diagram of the second integrator (32). Dedicated reset clock (ck_res) is replaced with ck2 in the second integrating capacitor circuitry (320).

Figure 15C:
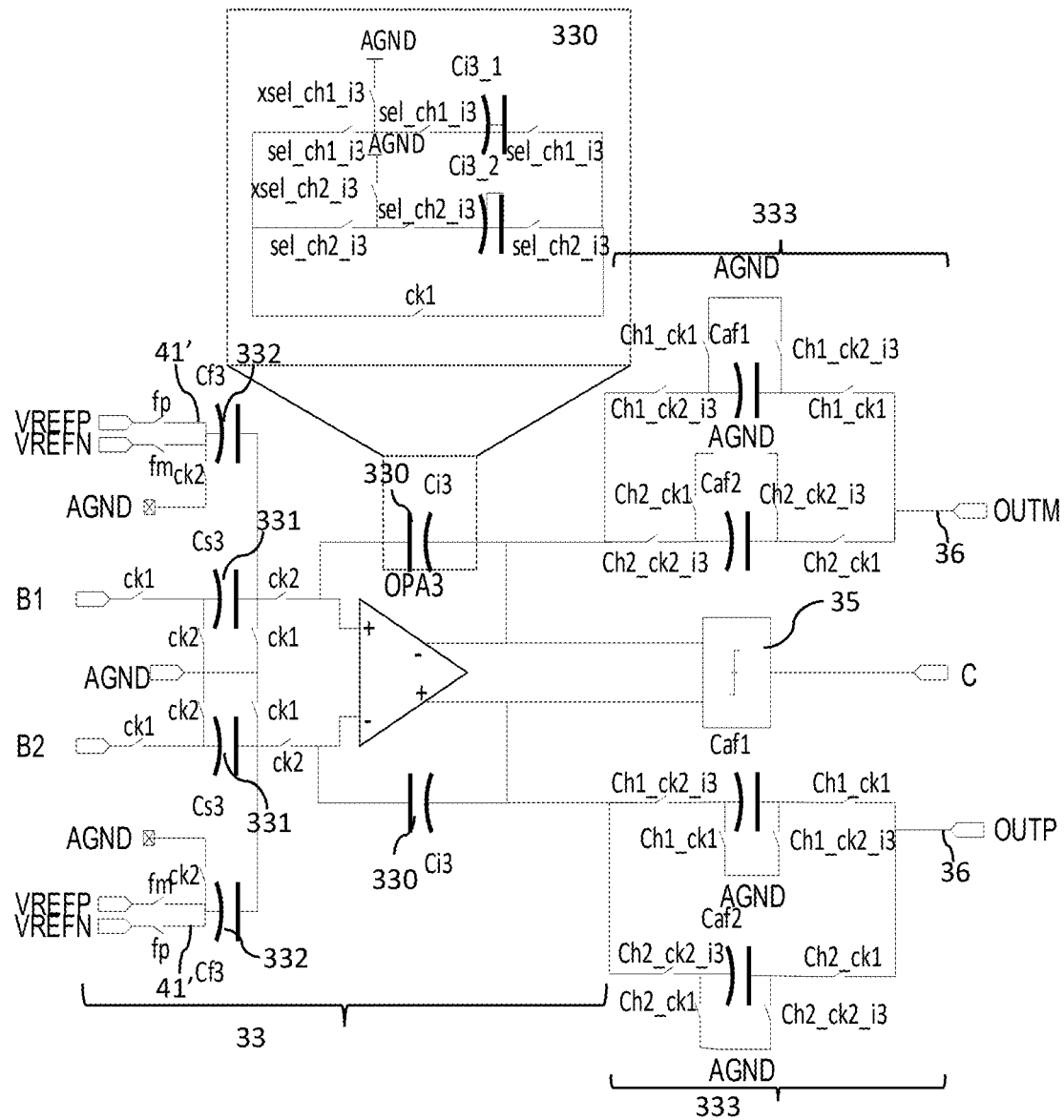

FIG. 15C shows a circuit diagram of the third integrator (33) as well as the quantizer (35) and local feedback circuitry (333). Dedicated reset clock (ck_res_i3) is replaced with ck1 in the third integrating capacitor circuitry (330).

Figure 16:
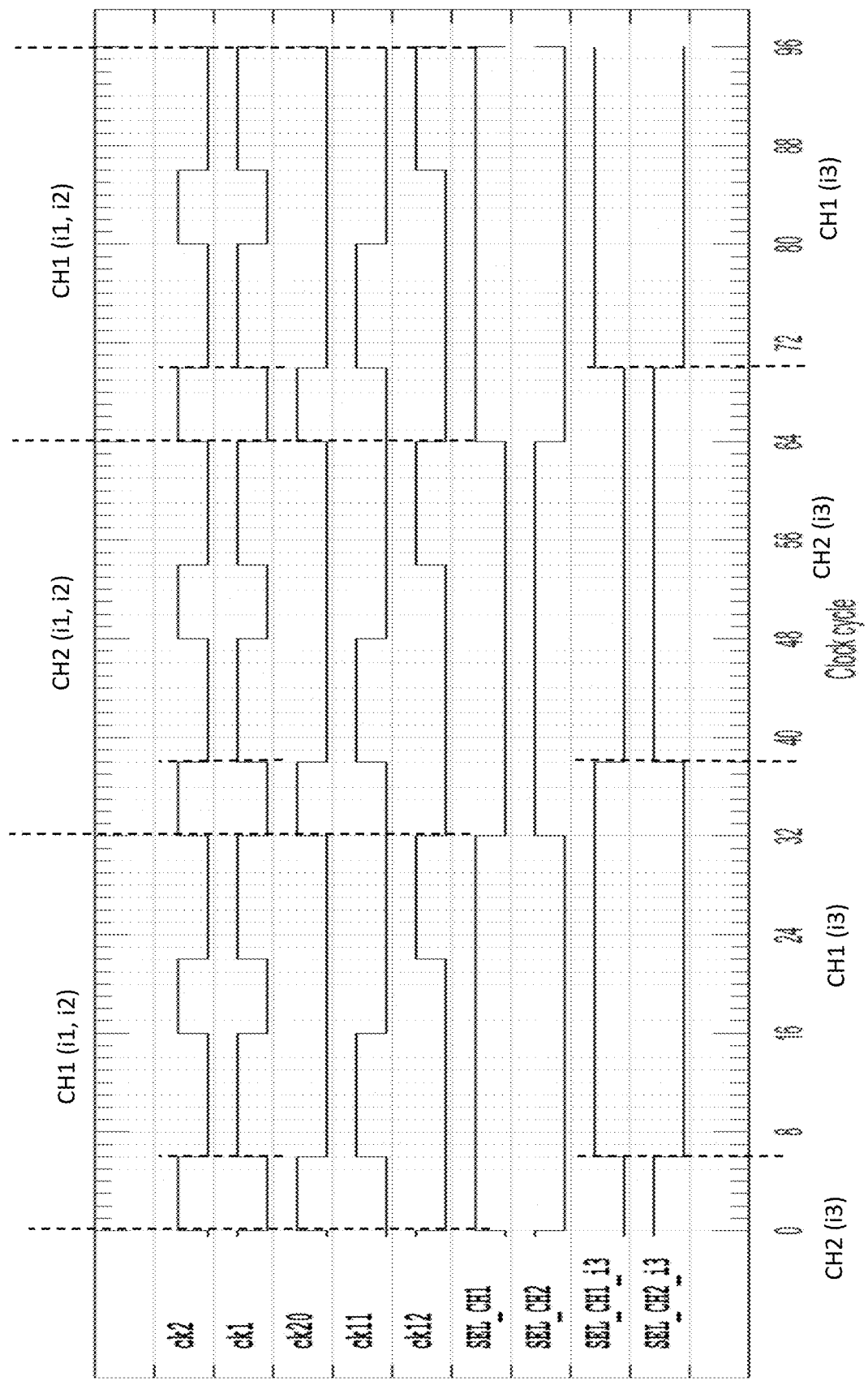
FIG. 16 illustrates clock cycles of the SDADC according to the third exemplary embodiment.

As can be seen from the schematics of FIGS. 15A, 15B and 15C, in the third exemplary embodiment, feedback for each integrator uses the same two signals VREFP and VREFN and these are controlled by the same two clocks fp and fm. As shown in FIG. 16, clocks fp and fm have mutually opposite phases.

Figure 15D:
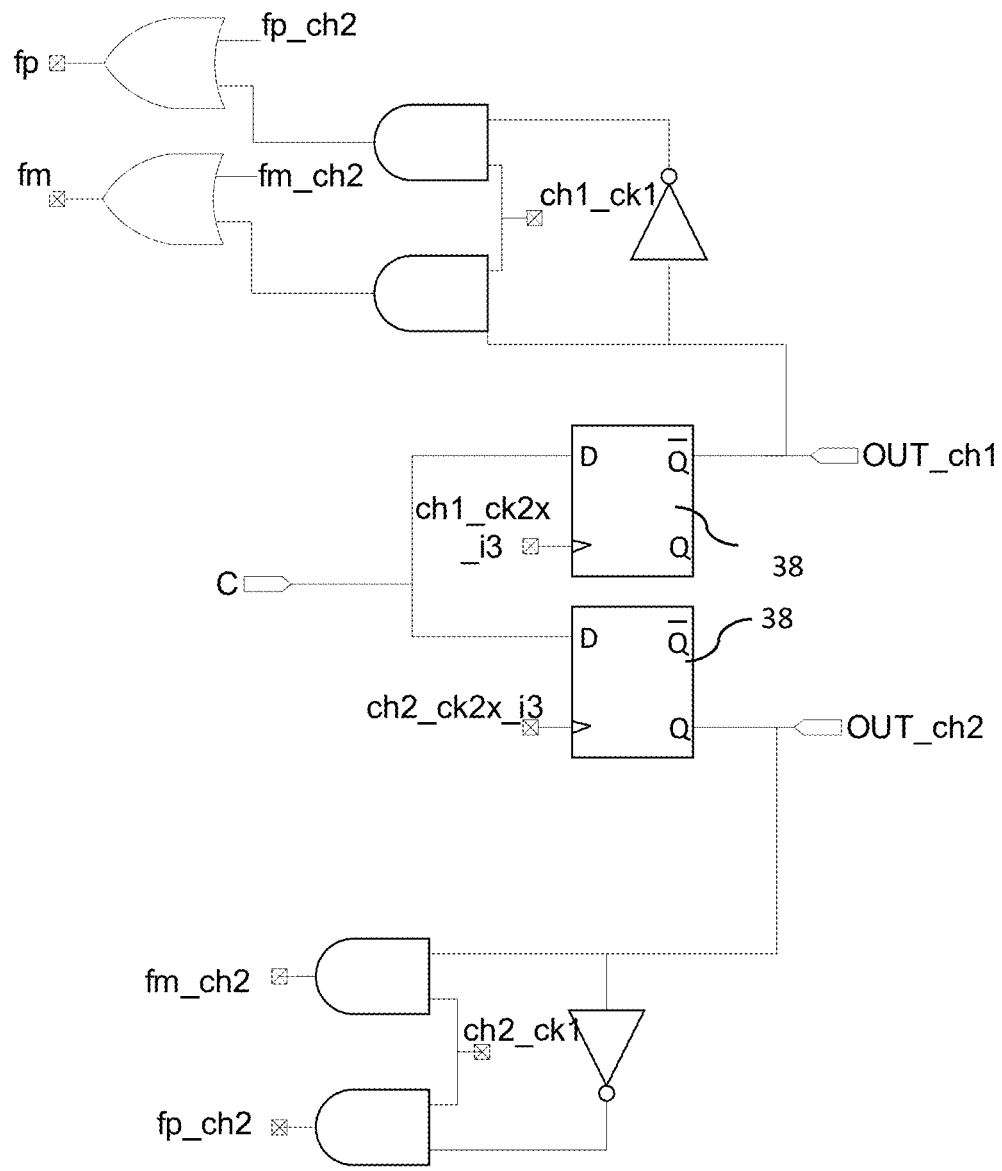

FIG. 15D is a circuit diagram of digital circuitry according to the third embodiment. Input (C) from the ADC (35), in this example a single-bit ADC implemented by a comparator, is received one channel at a time and read to a respective output register (38). The digital output signal (OUT_ch1, OUT_ch2) is also fed through digital circuitry that comprises logic ports for generating feedback signals (41, 41') for both channels. Due to simplified clocking scheme according to the third embodiment, fewer digital signals are required to perform the feedback and therefore also less digital circuitry is needed for controlling feedback signals.

FIG. 16 illustrates clocking scheme used in the circuitry shown in FIGS. 15A to 15D according to the third embodiment.

Logical relationships between channel selection clocks illustrated in FIG. 11E are applicable also for the third exemplary embodiment.

Clocks ck2 and ck1 are used for controlling input sampling by means of sampling capacitor sets (Cs1, Cs2, Cs3) of all integrators. The first (31) and third integrators (33) are delaying integrators. The first integrator (31) takes a sample during ck2 and passes the respective charge during ck1 through second integrator (32) to the third integrator's (33) sampling capacitor set (Cs3) (331). To enable this, the second integrator (32) is non-delaying and it is in integration phase during ck1 which causes a reset to be on ck2 for the second integrator (32). In this clocking scheme, the operational amplifier has no hold phase. Then third integrator (33), which samples during ck1, forwards the sampled charge to channel specific integration capacitor (330) during ck2. Also, during ck2 the integrator output is connected to the input of the quantizer (35), the output of which is sampled at falling edge of the ck2 by the respective channel specific output register (38).

Multiplexing two channels requires resetting operational amplifier before switching channels to avoid channel crosstalk. This third embodiment design benefits from resetting operational amplifiers (OPA1, OPA2, OPA3) during their respective hold-phases, instead of a typical approach that uses a dedicated reset phase controlled with a dedicated reset clock. The clocking scheme thus has a reset at hold-phase, in which the first and the second integrator (31, 32) are reset at ck2 and the third integrator (33) is reset at ck1. By implementing this innovative reset scheme, no dedicated reset clock and reset period needs to be assigned in the full clock cycle, and this allows more time for ck1 and ck2 without need to extend duration of the clock cycle. Additionally, with this approach the more performance critical first integrator (32) and second integrators (32) may be designed with longer settling time, whereas the third integrator (33) uses a shorter clock phase for charge transfer. However, the third integrator (33) typically has smaller capacitors and drives only the quantizer (35), and therefore tolerates the shorter clock phase for charge transfer without increased current consumption.

Channel selection clocks SEL_CH1 and SEL_CH2 are used to differentiate two channels but since these clocks associated with the first and second integrator (31, 32) switches to the other channel before charge is forwarded through third integrator (33), designated channel selection clocks SEL_CH1_i3 and SEL_CH2_i3 are used for controlling the third integrator (33). These designated third integrator channel selection clocks are delayed in comparison to the corresponding channel selection clocks SEL_CH1 and SEL_CH2 by up-time (i.e. pulse width) of ck2. Ck20 is based on clock ck2, but activates only on every second clock cycle, to enable double sampling of the input. Ck11 and Ck12 are used to forward two input samples of the same channel at two consecutive operating cycles.

Operation of the modulator according to the third embodiment can be explained as follows. During ck20, the modulator obtains in parallel two samples of the same input channel. The first sample is passed through first and second integrators (31, 32) during ck11/ck1. The first and second integrators (31, 32) receive their signal charge simultaneously during ck1. Also, the modulator feedback, operated by signals fm and fp, operates at ck1 phase. The feedbacks fm and fp are formed by digital circuitry shown in the figure using the clock signals and the modulators' digital output signal. In case of 1-bit output, the feedback simply translates to applying positive or negative feedback voltage VREFP/VREFN through designated feedback capacitors cf1 and cf2 to first and second integrator (31, 32) respectively.

In this aspect, second integrator (32) receives a second feedback (36) signal to form a notch in the noise transfer function. Such notch is an optional feature. This second, local feedback has its charge stored to a local feedback capacitor set (Caf1, Caf2) from previous corresponding channel at the third integrator's (33) output. The local feedback signal charge is moved to second integrator (32) during ck1 as well. As in the earlier disclosed embodiments, the local feedback signal (36) is fed in the input of the second integrator in the integrator chain, which can also be referred to as the input of the first integrator in the integrator chain after the first delaying integrator (31).

The signals from the first and second integrator modulator feedback and from the modulator input are stored in third integrator's (33) sampling capacitor set Cs3 (331) during ck1. The charge from the sampling capacitor set Cs3 is moved through the third integrator (33) during ck2 which is possible on the corresponding channel using the designated delayed third integrator channel selection clocks (SEL_Chx_i3, where x is 1 or 2) as discussed above.

The third integrator (33) receives feedback from modulator output utilizing the same method as the feedback for the first and second integrators (31, 32) with the exception that this feedback charge needs a delay to be applied on ck2 when third integrator (33) is in integration phase. This delay of charge is generated by storing the feedback charge to third integrators' feedback capacitor set cf3 (332) during ck1 and further by moving the feedback charge to the third integrator (31) during ck2.

The operation of the modulator during one operation cycle starting from the beginning of ck1 and ending at the end of ck2 was described above. Next, the same operation cycle is performed to the second identical sample charge taken at ck20 starting with ck12. After this, the operation cycle where new modulator input sample is taken and both sampled processed, persists.

Important note concerning the hold-phase integrator reset is that operation at each integrator output takes place during charge transfer. This is quite natural as the integrator's operational amplifier is being reset during the hold-phase. The design limitation because of this, however, is minimal.

Figure 17:
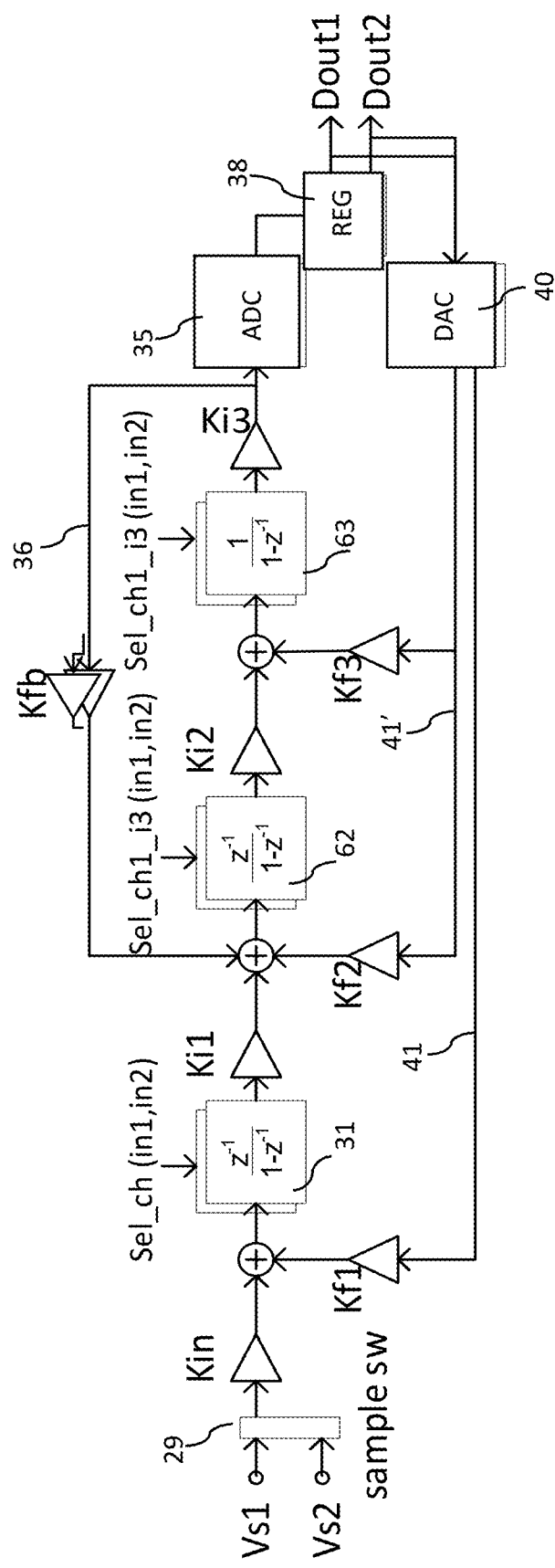
FIG. 17 illustrates in block level a third order SDADC with two-channel multiplexing capacity according to yet another exemplary embodiment.

FIG. 17 illustrates in block level a third order SDADC with two-channel multiplexing capacity according to another exemplary embodiment. In comparison to the circuitry illustrated in FIG. 6, in this embodiment the first non-delaying integrator (63) is disposed topologically only after the second delaying integrator (62). In other words, the integrator chain can start with two consecutive delaying integrators (31, 62) and thereafter at least the first non-delaying integrator (63). This alternative order of integrators sets more strict requirements for settling time of integrators than the preferred first to third embodiments, which makes optimizing the clocking scheme more challenging.

When the first non-delaying integrator (63) is placed in the integrator chain after the second delaying integrator (33), the second clock set, identified in the drawings by the suffix i3, is preferably used for clocking operation of the first non-delaying integrator (63) in addition to using it for clocking operation of the second delaying integrator (62) as in the first to third embodiments. In this alternative integrator chain topology, second feedback path (41') towards the first non-delaying integrator can be implemented with the same timing (same clock signals) as feedback path for the second delaying integrator. Further, in this alternative embodiment, the local feedback signal is input to the second delaying integrator (62), which is the second integrator in the integrator chain, in other words the first integrator in the integrator chain after the first delaying integrator (31).

According to further embodiments, another non-delaying integrator can be added as the final integrator in the integrator chain, thus arriving to a fourth-order SDADC. In such implementation, local feedback loop can be implemented between output of the fourth integrator and input of the third integrator in the integrator chain instead of obtaining the local feedback signal from the output of the third integrator.

In general, it is noted that the exemplary embodiments described above are intended to facilitate the understanding of the present invention, and are not intended to limit the interpretation of the present invention. The present invention may be modified and/or improved without departing from the spirit and scope thereof, and equivalents thereof are also included in the present invention. That is, exemplary embodiments obtained by those skilled in the art applying design change as appropriate on the embodiments are also included in the scope of the present invention as long as the obtained embodiments have the features of the present invention. For example, each of the elements included in each of the embodiments, and arrangement, materials, conditions, shapes, sizes, and the like thereof are not limited to those exemplified above, and may be modified as appropriate. It is to be understood that the exemplary embodiments are merely illustrative, partial substitutions or combinations of the configurations described in the different embodiments are possible to be made, and configurations obtained by such substitutions or combinations are also included in the scope of the present invention as long as they have the features of the present invention.

What is claimed:

1. A multiplexed sigma-delta analog-to-digital converter (ADC) for digitizing analog input signals of at least two input channels, the ADC comprising:
    input circuitry configured to obtain samples of said at least two input channels;
    a multiplexed integrator chain comprising:
        a first delaying integrator configured to process a sample of one of said at least two input channels at a time,
        a second delaying integrator, and
        a first non-delaying integrator disposed in an integrator chain either between the first delaying integrator and the second delaying integrator or after the second delaying integrator;
    a clocking arrangement that includes:
        a first clock set comprising first clocks and first channel selection clocks configured to control the first delaying integrator and the first non-delaying integrator when the first non-delaying integrator is disposed between the first delaying integrator and the second delaying integrator, and
        a second clock set comprising second clocks and second channel selection clocks configured to control the second delaying integrator and the first non-delaying integrator when the first non-delaying integrator is disposed after the second delaying integrator, wherein the second channel selection clocks are delayed in comparison to the first channel selection clocks for preventing data from being mixed between consecutive full clock cycles;
    a quantizer configured to convert an output of a last integrator in the integrator chain into a digital signal;
    a first feedback line configured to feed back a first feedback signal to an input of first delaying integrator; and
    a second feedback line configured to feed back a second feedback signal at respective inputs of the first non-delaying integrator and the second delaying integrator,
    wherein the first and second feedback signals represent at least one analog value that corresponds to a digital signal at an output of the sigma-delta ADC.

2. The multiplexed sigma-delta ADC according to claim 1, wherein each of the first and second feedback lines comprises feedback capacitor sets coupled at the input of the respective integrators, and the respective feedback capacitor sets are configured to be charged with a positive or negative charge according to a former digital output of the multiplexed sigma-delta ADC, with the former digital output relating to the respective one of at least two channels that is currently being integrated by the respective integrator.

3. The multiplexed sigma-delta ADC according to claim 2, wherein the former digital output is obtained from one of at least two digital output registers coupled to an output of the quantizer.

4. The multiplexed sigma-delta ADC according to claim 1, further comprising:
    a local feedback loop configured to feed back a local feedback signal at an input of the second integrator in the integrator chain, wherein the local feedback signal corresponds to an analog output signal received at the output of a third integrator in the integrator chain, wherein the local feedback loop comprises a local feedback circuitry comprising at least two parallel capacitors for storing respective feedback charges of the at least two channels as the local feedback signal and a switching arrangement for selecting the local feedback signal of the respective one of the channels to be fed back at the input of the first non-delaying integrator.

5. The multiplexed sigma-delta ADC according to claim 4, wherein the local feedback signal is controlled based on the second clock set and feeding back the local feedback signal is controlled based on the first clock set for preventing data from being mixed between the consecutive full clock cycles.

6. The multiplexed sigma-delta ADC according to claim 1, wherein the second channel selection clocks are delayed in comparison to the first channel selection clocks by less than a half of a full clock cycle determined by two consecutive first reset clocks of the first clock set, and by more than duration of a reset period determined by the first reset clock of the first clock set.

7. The multiplexed sigma-delta ADC according to claim 1, wherein, when no dedicated reset clocks are included in the first and second clock sets, the second channel selection clocks are delayed in comparison to the respective first channel selection clocks by more than duration of a clock period that causes coupling of a sampling capacitor set of the first delaying integrator to an analog ground between two consecutive samples and causes coupling of a first feedback loop and a second feedback loop to the analog ground.

8. The multiplexed sigma-delta ADC according to claim 1,
wherein the first delaying integrator comprises a sampling capacitor set that includes at least two parallel sampling capacitors for single-ended operation or at least two parallel sampling capacitor pairs for double-ended operation, and
wherein a number of parallel sampling capacitors or parallel sampling capacitor pairs in the sampling capacitor set equals the number of channels that are being multiplexed.

9. The multiplexed sigma-delta ADC according to claim 8, wherein the sampling capacitor set is configured to store samples of said at least two input channels simultaneously and said samples of said at least two input channels are moved forward for integrating a sample of one channel at a time.

10. The multiplexed sigma-delta ADC according to claim 8, wherein the sampling capacitor set is configured to sample said analog input channels at mutually different times, storing simultaneously at least two samples of the same one of the at least two input channels, and a switching arrangement is configured to move the at least two samples of the same one forward for integrating the at least two samples of the same channel, one sample at a time, during at least two consecutive full clock cycles.

11. The multiplexed sigma-delta ADC according to claim 1, wherein the integrator chain further comprises a second non-delaying integrator disposed as a last integrator in the integrator chain, and the second clock set is further configured to control the second non-delaying integrator.

12. The multiplexed sigma-delta ADC according to claim 1, further comprising circuitry configured to reset an operational amplifier of each respective integrator in the integrator chain at a beginning of each adjacent full clock cycle of the respective integrator, before integrating the next sample, irrespective of whether the respective integrator processes different channels at each adjacent full clock cycle or a same channel multiple times during adjacent full clock cycles.

13. The multiplexed sigma-delta ADC according to claim 1, further comprising a switching arrangement that is configured to implement a delay in feeding the second feedback signal towards the first non-delaying integrator and the second delaying integrator in comparison to feeding the first feedback signal towards the first delaying integrator for preventing feedback signals from being mixed between consecutive full clock cycles.

14. A sigma-delta analog-to-digital conversion method for digitizing analog input signals of at least two input channels by a multiplexed sigma-delta analog-to-digital converter (ADC), the method comprising:
integrating a sample of one of said at least two input channels at a time by a multiplexed integrator chain, the integrating including:
integrating the sample by a first delaying integrator in the integrator chain, wherein operation of the first delaying integrator is controlled by a first clock set comprising first clocks and first channel selection clocks,
integrating the sample by a first non-delaying integrator disposed in the integrator chain right after the first delaying integrator, wherein the first non-delaying integrator is controlled by the first clock set, and
integrating the sample by a second delaying integrator disposed in the integrator chain topologically after the first delaying integrator, wherein the second delaying integrator is controlled by a second clock set comprising second clocks and second channel selection clocks;
quantizing an output of a last integrator in the integrator chain to provide an output of the multiplexed sigma-delta ADC;
delaying the second channel selection clock set relative to the first channel selection clock set to prevent data from being mixed between consecutive full clock cycles;
feeding back a first feedback signal at an input of the first delaying integrator; and
feeding back a second feedback signal at respective inputs of the first non-delaying integrator and the second delaying integrator,
wherein the first and second feedback signals represent an analog value that corresponds to a digital signal at an output of the multiplexed sigma-delta ADC.

15. The sigma-delta analog-to-digital conversion method according to claim 14,
wherein said feeding back comprises charging a feedback capacitor set that is coupled to an input of a respective integrator with a positive or negative charge according to a former digital output of the multiplexed sigma-delta ADC that concerns a respective one of the at least two channels that is currently being integrated by the respective integrator, and
wherein the former digital output is obtained from one of at least two digital output registers coupled to an output of the quantizer.

16. The sigma-delta analog-to-digital conversion method according to claim 14, further comprising:
receiving an analog output signal at an output of a third integrator in the integrator chain;
feeding back the analog output signal as a local feedback signal at an input of the second integrator in the integrator chain;
storing a feedback charge to be used as the local feedback signal of one of the at least two channels to one of at least two parallel capacitors of a local feedback circuitry provided at an input of the first non-delaying integrator by a switching arrangement of the local feedback circuitry for selecting the local feedback signal of the respective one of the channels to be fed back;

controlling generation of the local feedback signal based on the second clock set; and controlling feeding back the local feedback signal based on the first clock set for preventing data from being mixed between consecutive full clock cycles.

17. The sigma-delta analog-to-digital conversion method according to any claim 14, further comprising:

simultaneously storing samples in at least two parallel sampling capacitors for single-ended operation or in at least two parallel sampling capacitor pairs for double-ended operation, wherein a number of parallel sampling capacitors or sampling capacitor pairs equals the number of channels that are being multiplexed.

18. A sigma-delta analog-to-digital conversion method for digitizing analog input signals of at least two input channels by a multiplexed sigma-delta analog-to-digital converter (ADC), the method comprising:

integrating a sample of one of said at least two input channels at a time by a multiplexed integrator chain, the integrating including:

integrating the sample by a first delaying integrator in the integrator chain, wherein operation of the first delaying integrator is controlled by a first clock set comprising first clocks and first channel selection clocks, integrating the sample by a first non-delaying integrator disposed in the integrator chain right after a second delaying integrator, wherein the first non-delaying integrator is controlled by a second clock set comprising second clocks and second channel selection clocks, and integrating the sample by the second delaying integrator disposed in the integrator chain topologically after the first non-delaying integrator, wherein the second delaying integrator is controlled by the second clock set;

quantizing an output of a last integrator in the integrator chain to provide an output of the multiplexed sigma-delta ADC;

delaying the second channel selection clock set relative to the first channel selection clock set to prevent data from being mixed between consecutive full clock cycles;

feeding back a first feedback signal at an input of the first delaying integrator; and feeding back a second feedback signal at respective inputs of the first non-delaying integrator and the second delaying integrator, wherein the first and second feedback signals represent an analog value that corresponds to a digital signal at an output of the multiplexed sigma-delta ADC.

19. The sigma-delta analog-to-digital conversion method according to claim 18, wherein said feeding back comprises charging a feedback capacitor set that is coupled to an input of a respective integrator with a positive or negative charge according to a former digital output of the multiplexed sigma-delta ADC that concerns a respective one of the at least two channels that is currently being integrated by the respective integrator, and wherein the former digital output is obtained from one of at least two digital output registers coupled to an output of the quantizer.

20. The sigma-delta analog-to-digital conversion method according to claim 18, further comprising:

receiving an analog output signal at an output of a third integrator in the integrator chain;

feeding back the analog output signal as a local feedback signal at an input of the second integrator in the integrator chain;

storing a feedback charge to be used as the local feedback signal of one of the at least two channels to one of at least two parallel capacitors of a local feedback circuitry provided at an input of the first non-delaying integrator by a switching arrangement of the local feedback circuitry for selecting the local feedback signal of the respective one of the channels to be fed back;

controlling generation of the local feedback signal based on the second clock set; and controlling feeding back the local feedback signal based on the first clock set for preventing data from being mixed between consecutive full clock cycles.

* * * * *